US012784815B2

(12) United States Patent
Ito et al.

(10) Patent No.: US 12,784,815 B2
(45) Date of Patent: Nov. 3, 2026

(54) NAND FLASH MEMORY EXECUTING HIGH-SPEED MODE READ OPERATION

(71) Applicant: Kioxia Corporation, Tokyo (JP)

(72) Inventors: Tomohiko Ito, Kawasaki Kanagawa (JP); Hiroshi Yoshihara, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 180 days.

(21) Appl. No.: 18/600,715

(22) Filed: Mar. 10, 2024

(65) Prior Publication Data

US 2024/0312513 A1 Sep. 19, 2024

(30) Foreign Application Priority Data

Mar. 15, 2023 (JP) ................................. 2023-041241

(51) Int. Cl.

| | |
|---|---|
| ***G11C 16/10*** | (2006.01) |
| ***G11C 11/4074*** | (2006.01) |
| ***G11C 11/408*** | (2006.01) |
| ***G11C 11/4096*** | (2006.01) |
| ***G11C 16/08*** | (2006.01) |
| ***G11C 16/26*** | (2006.01) |
| ***G11C 16/32*** | (2006.01) |
| ***G11C 16/34*** | (2006.01) |
| *G11C 16/04* | (2006.01) |

(52) U.S. Cl.
CPC ...... *G11C 11/4096* (2013.01); *G11C 11/4074* (2013.01); *G11C 11/4085* (2013.01); *G11C 16/08* (2013.01); *G11C 16/26* (2013.01); *G11C 16/32* (2013.01); *G11C 16/3427* (2013.01); *G11C 16/0483* (2013.01)

(58) Field of Classification Search
CPC ............ G11C 16/3427; G11C 16/3459; G11C 16/102; G11C 16/26; G11C 11/5628; G11C 16/0483; G11C 16/10; G11C 16/30
See application file for complete search history.

(56) References Cited

U.S. PATENT DOCUMENTS

| | | | | |
|---|---|---|---|---|
| 6,501,695 B1 | 12/2002 | Brown | | |
| 8,767,494 B2 | 7/2014 | Yang et al. | | |
| 8,773,942 B2 | 7/2014 | Stephani et al. | | |
| 2009/0316487 A1* | 12/2009 | Lee | G11C 11/5635 | 365/189.11 |
| 2011/0032757 A1* | 2/2011 | Dutta | G11C 16/3427 | 365/189.05 |
| 2012/0008413 A1* | 1/2012 | Jeong | G11C 11/5628 | 365/185.24 |

(Continued)

*Primary Examiner* — Mushfique Siddique
(74) *Attorney, Agent, or Firm* — Holtz, Holtz & Volek PC

(57) ABSTRACT

According to one embodiment, a semiconductor memory device includes a first memory string including a first memory cell transistor; a second memory string including a second memory cell transistor; a first word line commonly coupled to a gate of each of the first memory cell transistor and the second memory cell transistor; and a control circuit, wherein during a first read operation of reading data from the first memory string, a threshold voltage of the first memory cell transistor is less than a first voltage, a threshold voltage of the second memory cell transistor is equal to or greater than the first voltage, and the control circuit is configured to supply a voltage equal to or less than the first voltage to the first word line.

19 Claims, 27 Drawing Sheets

(56) References Cited

U.S. PATENT DOCUMENTS

| | | | | |
|---|---|---|---|---|
| 2018/0240515 | A1* | 8/2018 | Shibata .............. | G11C 16/3459 |
| 2021/0233596 | A1* | 7/2021 | Kamata .................. | G11C 16/32 |
| 2022/0208276 | A1* | 6/2022 | Wu .................... | G11C 16/0483 |
| 2022/0270687 | A1* | 8/2022 | Tokutomi ........... | G11C 16/0483 |

* cited by examiner

| Block | Operation mode |
|---|---|
| BLK0 | High-speed mode |
| BLK1 | High-speed mode |
| BLK2 | Normal mode |
| ⋮ | ⋮ |
| BLK(n−2) | Normal mode |
| BLK(n−1) | Normal mode |

F I G. 8

| Page | Data | | | |
|---|---|---|---|---|
| High-order | 1 | 0 | 0 | 1 |
| Low-order | 1 | 1 | 0 | 0 |

| | State of MT("PRM") | State of MT("INH") | State of ST1("PRM") | State of ST1("INH") |
|---|---|---|---|---|
| Before acceleration operation | "Er" | "Er" | "s0" | "s0" |
| After acceleration operation, before write operation | "Er" | "D" | "s0" | "s1" |

FIG. 16

NAND FLASH MEMORY EXECUTING HIGH-SPEED MODE READ OPERATION

CROSS-REFERENCE TO RELATED APPLICATIONS

This application is based upon and claims the benefit of priority from Japanese Patent Application No. 2023-041241, filed Mar. 15, 2023, the entire contents of which are incorporated herein by reference.

FIELD

Embodiments described herein relate generally to a semiconductor memory device.

BACKGROUND

A NAND-type flash memory is known as a semiconductor memory device capable of nonvolatilely storing data. In the NAND-type flash memory, a three-dimensional memory structure is adopted for high integration and large capacity.

BRIEF DESCRIPTION OF DRAWINGS

FIG. 8 is a diagram showing an example of operation mode information in the embodiment.

FIG. 16 is a diagram showing examples of threshold voltages of a memory cell transistor and a select transistor before the acceleration operation and after the acceleration operation using the semiconductor memory device according to the embodiment.

DETAILED DESCRIPTION

Figure 1:
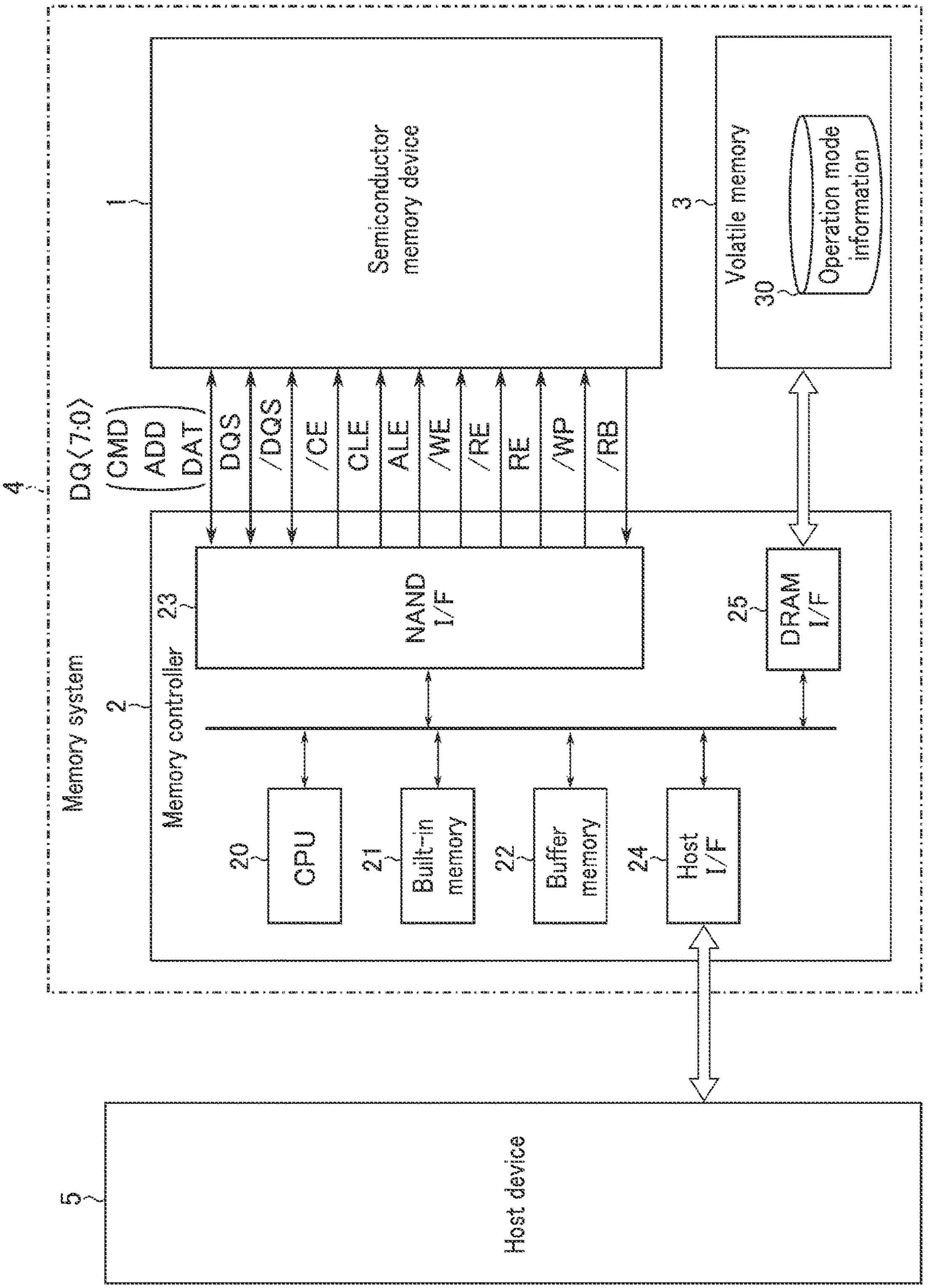
FIG. 1 is a block diagram showing an example of a configuration of a memory system including a semiconductor memory device according to an embodiment, and a host device.

In general, according to one embodiment, a semiconductor memory device includes a first memory string in which a plurality of memory cell transistors including a first memory cell transistor is coupled in series; a second memory string in which a plurality of memory cell transistors including a second memory cell transistor is coupled in series; a first word line commonly coupled to a gate of each of the first memory cell transistor and the second memory cell transistor; and a control circuit, wherein during a first read operation of reading data from the first memory string, a threshold voltage of the first memory cell transistor is less than a first voltage, a threshold voltage of the second memory cell transistor is equal to or greater than the first voltage, and the control circuit is configured to supply a voltage equal to or less than the first voltage to the first word line.

Hereinafter, an embodiment will be described with reference to the drawings. Note that dimensions and ratios in the drawings are not necessarily the same as actual ones. In addition, constituent elements having substantially the same functions and configurations are denoted by the same reference signs in the following description. In addition, if elements having similar configurations are particularly distinguished from each other, different characters or numbers can be added to the end of the same reference signs.

1. Embodiment

Hereinafter, a semiconductor memory device according to an embodiment will be described.

1.1 Configuration

A configuration of the semiconductor memory device according to the embodiment will be described.

1.1.1 Memory System

First, a configuration example of a memory system will be described with reference to FIG. 1. FIG. 1 is a block diagram showing an example of a configuration of a memory system including the semiconductor memory device according to the embodiment, and a host device.

A memory system 4 is, for example, a solid state drive (SSD) or an SD™ card. The memory system 4 is coupled to, for example, an external host device 5. The memory system 4 stores data from the host device 5. In addition, the memory system 4 reads data to the host device 5.

The memory system 4 includes a semiconductor memory device 1, a memory controller 2, and a volatile memory 3. Note that the semiconductor memory device 1, the memory controller 2, and the volatile memory 3 may constitute one semiconductor device by a combination thereof, for example.

The semiconductor memory device 1 is, for example, a NAND-type flash memory. The semiconductor memory device 1 nonvolatilely stores data. The semiconductor memory device 1 is coupled to the memory controller 2 by a NAND bus. In the following, a case where the semiconductor memory device 1 is a NAND-type flash memory will be described as an example.

The NAND bus transmits and receives signals DQ<7:0>, DQS, /DQS, /CE, CLE, ALE, /WE, /RE, RE, /WP, and /RB according to a NAND interface via individual signal lines. The signal/CE is a chip enable signal. The signal /CE is a signal for enabling the semiconductor memory device 1. The signal CLE is a command latch enable signal. While the signal CLE is at a "High (H)" level, the semiconductor memory device 1 is notified that the signal DQ<7:0> flowing through the semiconductor memory device 1 is a command. The signal ALE is an address latch enable signal. While the signal ALE is at the "H" level, the semiconductor memory device 1 is notified that the signal DQ<7:0> flowing through the semiconductor memory device 1 is an address. The signal/WE is a write enable signal. The signal/WE instructs the semiconductor memory device 1 to fetch the signal DQ<7:0>. For example, the signal/WE instructs the semiconductor memory device 1 to fetch the signal DQ<7:0> as a command, an address, or data at a rising edge of the signal/WE at a single data rate (SDR). In addition, the signal/WE instructs the semiconductor memory device 1 to fetch the signal DQ<7:0> as a command or an address at a rising edge of the signal /WE at a double data rate (DDR). The signal/RE is a read enable signal. The signal/RE instructs the semiconductor memory device 1 to output the signal DQ<7:0>. For example, the signal/RE instructs the semiconductor memory device 1 to output the signal DQ<7:0> as data at a falling edge of the signal/RE at the single data rate. In addition, the signal/RE instructs the semiconductor memory device 1 to output the signal DQ<7:0> as data at a falling edge and a rising edge of the signal/RE at the double data rate. The signal RE is a complementary signal of the signal/RE. The signal/WP is a write protect signal. The signal/WP instructs the semiconductor memory device 1 to prohibit writing and erasing data. The signal /RB is a ready busy signal. The signal/RB indicates whether the semiconductor memory device 1 is in a ready state (a state of accepting an external instruction) or a busy state (a state of not accepting an external instruction). The signal DQ<7:0> is, for example, an 8-bit signal. The signal DQS is a data strobe signal. The signal DQS is used to control an operation timing of the semiconductor memory device 1 according to the signal DQ<7:0>. For example, the signal DQS instructs the semiconductor memory device 1 to fetch the signal DQ<7:0> as data at a falling edge and a rising edge of the signal DQS at the double data rate. In addition, the signal DQS is generated based on a falling edge and a rising edge of the signal/RE at the double data rate. The signal DQS is output from the semiconductor memory device 1 together with the signal DQ<7:0> as data. The signal/DQS is a complementary signal of the signal DQS.

The signal DQ<7:0> is transmitted and received between the semiconductor memory device 1 and the memory controller 2, and includes a command CMD, an address ADD, and data DAT. The command CMD includes, for example, a command causing the semiconductor memory device 1 to execute an erase operation (erase command), a command causing the semiconductor memory device 1 to execute a write operation (write command), a command causing the semiconductor memory device 1 to execute a read operation (read command), and the like. The data DAT includes read data and write data.

The memory controller 2 receives an instruction from the host device 5. The memory controller 2 controls the semiconductor memory device 1 based on the received instruction. Specifically, the memory controller 2 writes data instructed to be written into the semiconductor memory device 1 based on a write instruction received from the host device 5. In addition, the memory controller 2 reads, from the semiconductor memory device 1, data instructed to be read by the host device 5 based on a read instruction received from the host device 5, and transmits the data to the host device 5.

The volatile memory 3 is, for example, a dynamic random access memory (DRAM). The volatile memory 3 stores firmware for managing the semiconductor memory device 1 and various types of management information. The volatile memory 3 stores, for example, operation mode information 30. The operation mode information 30 is information for executing the write operation and the read operation. The operation mode information 30 includes information regarding an operation mode applied to the semiconductor memory device 1 when the write operation and the read operation are executed. Details of the operation mode information 30 will be described later.

Examples of the host device 5 using the memory system 4 described above include a digital camera, a personal computer, a server in a data center, and the like.

1.1.2 Memory Controller

A configuration of the memory controller 2 will be described continuously with reference to FIG. 1.

The memory controller 2 includes a central processing unit (CPU) 20, a built-in memory 21, a buffer memory 22, a NAND interface circuit (NAND I/F) 23, a host interface circuit (host I/F) 24, and a DRAM interface circuit (DRAM I/F) 25. The memory controller 2 is configured as a system-on-a-chip (SoC), for example.

The CPU 20 controls the overall operation of the memory controller 2. The CPU 20 issues, for example, a command for instructing the semiconductor memory device 1 to execute various operations such as the write operation, the read operation, and the erase operation.

The built-in memory 21 is, for example, a semiconductor memory such as a DRAM. The built-in memory 21 is used as a work region of the CPU 20. The built-in memory 21 stores firmware for managing the semiconductor memory device 1, various management tables, and the like.

The buffer memory 22 temporarily stores write data received from the host device 5, read data received by the memory controller 2 from the semiconductor memory device 1, and the like.

The NAND interface circuit 23 is coupled to the semiconductor memory device 1 via a NAND bus and manages communication with the semiconductor memory device 1. The NAND interface circuit 23 transmits the command CMD, the address ADD, and the write data to the semiconductor memory device 1 under an instruction of CPU 20. In addition, the NAND interface circuit 23 receives the read data from the semiconductor memory device 1.

The host interface circuit 24 is coupled to the host device 5 via a host bus and manages communication between the memory controller 2 and the host device 5. The host interface circuit 24 transfers, for example, the instruction and data received from the host device 5 to the CPU 20 and the buffer memory 22, respectively.

The DRAM interface circuit 25 is coupled to the volatile memory 3. The DRAM interface circuit 25 manages communication between the memory controller 2 and the volatile memory 3. The DRAM interface circuit 25 performs communication based on the DRAM interface standard.

1.1.3 Semiconductor Memory Device

Figure 2:
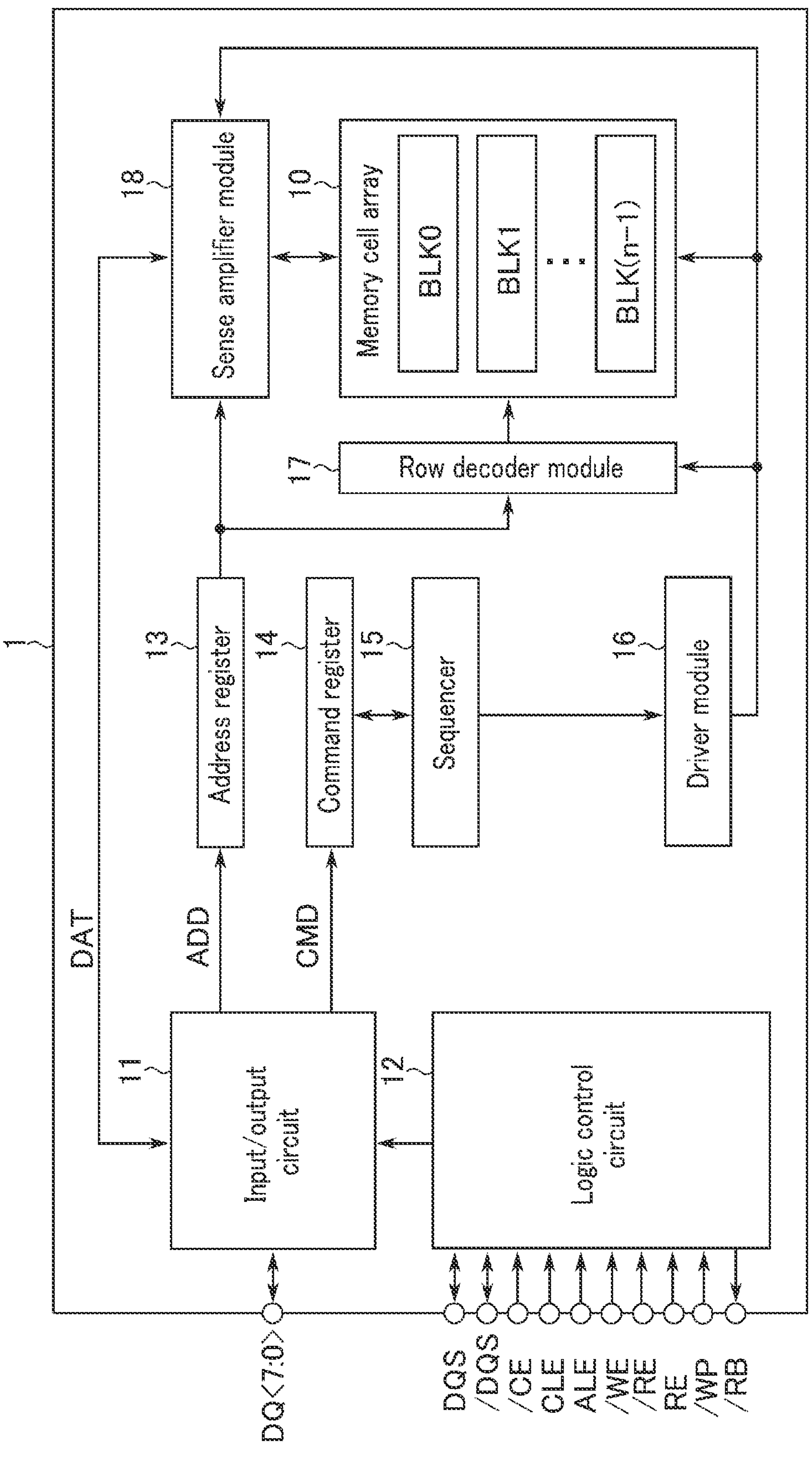
FIG. 2 is a block diagram showing an example of a configuration of the semiconductor memory device according to the embodiment.

Next, an internal configuration of the semiconductor memory device 1 will be described with reference to FIG. 2. FIG. 2 is a block diagram showing an example of a configuration of the semiconductor memory device according to the embodiment.

The semiconductor memory device 1 includes a memory cell array 10, an input/output circuit 11, a logic control circuit 12, an address register 13, a command register 14, a sequencer 15, a driver module 16, a row decoder module 17, and a sense amplifier module 18.

The memory cell array 10 includes a plurality of blocks BLK0 to BLK(n−1) (n is an integer of 2 or more). Each block BLK is a set of a plurality of memory cell transistors capable of nonvolatilely storing data, and is used as a data erasing unit, for example. That is, the data stored in the memory cell transistors included in the same block BLK is erased all at once. A detailed configuration of the memory cell array 10 will be described later.

The input/output circuit 11 transmits and receives the signal DQ<7:0> to and from the memory controller 2. The input/output circuit 11 transfers the address ADD and the command CMD in the signal DQ<7:0> to the address register 13 and the command register 14, respectively. In addition, the input/output circuit 11 transmits and receives the data DAT to and from the sense amplifier module 18.

The logic control circuit 12 receives, for example, the signals DQS, /DQS, /CE, CLE, ALE, /WE, /RE, RE, and/WP from the memory controller 2. The logic control circuit 12 controls the input/output circuit 11 based on the received signals. In addition, the logic control circuit 12 generates and transmits the signal/RB to the memory controller 2.

The address register 13 stores the address ADD transferred from the input/output circuit 11. The address register 13 transfers the stored address ADD to the row decoder module 17 and the sense amplifier module 18.

The command register 14 stores the command CMD transferred from the input/output circuit 11. The command register 14 transfers the stored command CMD to the sequencer 15.

The sequencer 15 receives the command CMD from the command register 14 and controls the entire semiconductor memory device 1 in accordance with a sequence based on the received command CMD. For example, in a case of receiving the erase command, the write command, and the read command, the sequencer 15 instructs the driver module 16 to generate voltages to be used in the corresponding operations.

The driver module 16 generates voltages to be used in the erase operation, the write operation, the read operation, and the like based on the instruction from the sequencer 15, and supplies the generated voltages to the memory cell array 10, the row decoder module 17, the sense amplifier module 18, and the like.

The row decoder module 17 receives a block address in the address ADD from the address register 13, and selects one of the blocks BLK0 to BLK(n−1) based on the block address. The row decoder module 17 supplies the voltage supplied from the driver module 16 to the selected block BLK, for example.

The sense amplifier module 18 receives a column address in the address ADD from the address register 13. The sense amplifier module 18 transfers the data DAT between the memory controller 2 and the memory cell array 10 based on the column address. More specifically, during the write operation, the sense amplifier module 18 receives write data from the input/output circuit 11. The sense amplifier module 18 transfers the write data to the memory cell array 10. In addition, during the read operation, the sense amplifier module 18 senses a threshold voltage of a memory cell transistor that is a target of the read operation in the memory cell array 10 to generate read data. The sense amplifier module 18 transfers the read data to the input/output circuit 11.

Note that, the semiconductor memory device 1 may be configured to store the operation mode information 30, although not shown. The semiconductor memory device 1 stores the operation mode information 30 by, for example, a configuration in the memory cell array 10 or the semiconductor memory device 1, which is not shown. In this case, the volatile memory 3 can store, for example, all or a part of the operation mode information 30 stored in the semiconductor memory device 1.

1.1.4 Circuit Configuration of Memory Cell Array

Figure 3:
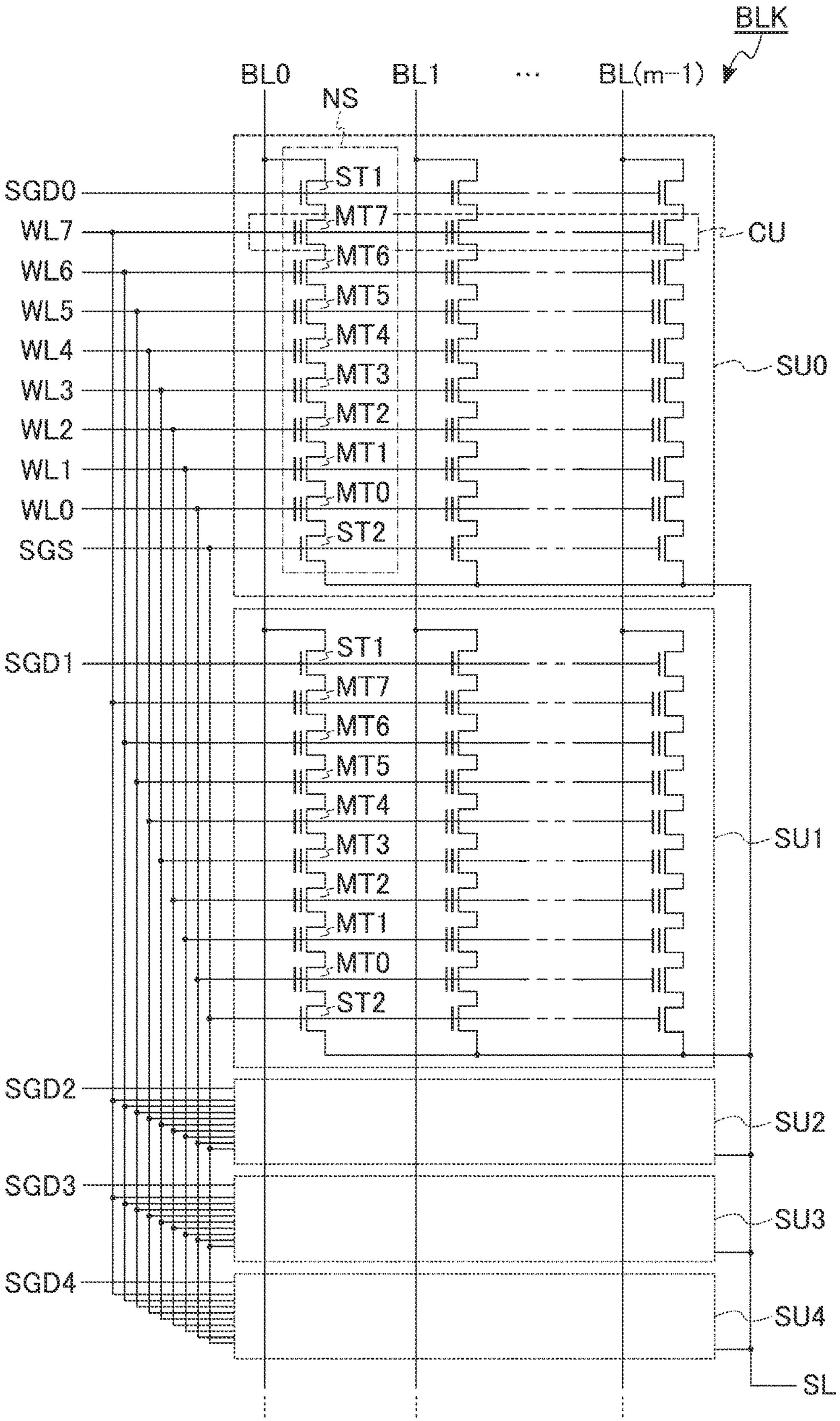
FIG. 3 is a circuit diagram for explaining an example of a configuration of a memory cell array of the semiconductor memory device according to the embodiment.

An example of a circuit configuration of the memory cell array 10 will be described with reference to FIG. 3. FIG. 3 is a circuit diagram for explaining an example of a configuration of the memory cell array of the semiconductor memory device according to the embodiment. FIG. 3 shows a circuit of one block BLK among the blocks BLK included in the memory cell array 10. In the example shown in FIG. 3, the block BLK includes five string units SU0, SU1, SU2, SU3, and SU4.

Each string unit SU includes a plurality of NAND strings NS associated with respective bit lines BL0 to BL(m−1) (m is an integer of 2 or more). Each NAND string NS includes, for example, memory cell transistors MT0 to MT7 and select transistors ST1 and ST2. Each of the memory cell transistors MT0 to MT7 includes a control gate and a charge storage film. Each of the memory cell transistors MT0 to MT7 nonvolatilely holds data. The select transistors ST1 and ST2 are used to select the string units SU during various operations. Note that, in the following description, if the bit lines BL0 to BL(m−1) are not distinguished, each of the bit lines BL0 to BL(m−1) is simply referred to as a bit line BL. In addition, if the memory cell transistors MT0 to MT7 are not distinguished, each of the memory cell transistors MT0 to MT7 is simply referred to as a memory cell transistor MT. In addition, if the select transistors ST1 and ST2 are not distinguished, each of the select transistors ST1 and ST2 is simply referred to as a select transistor ST.

In each NAND string NS, the memory cell transistors MT0 to MT7 are coupled in series. A first end of the select transistor ST1 is coupled to the bit line BL associated with the select transistor ST1. A second end of the select transistor ST1 is coupled to one ends of the memory cell transistors MT0 to MT7 coupled in series. A first end of the select transistor ST2 is coupled to the other ends of the memory cell transistors MT0 to MT7 coupled in series. A second end of the select transistor ST2 is coupled to a source line SL.

In the same block BLK, control gates of the memory cell transistors MT0 to MT7 are coupled to word lines WL0 to WL7, respectively. Gates of the select transistors ST1 in the string units SU0 to SU4 are coupled to select gate lines SGD0 to SGD4, respectively. In contrast, gates of the select transistors ST2 are commonly coupled to a select gate line SGS. However, the gates are not limited thereto, and the gates of the select transistors ST2 may be coupled to respective select gate lines SGS, which are different for each string unit SU. Note that, in the following description, if the word lines WL0 to WL7 are not distinguished, each of the word lines WL0 to WL7 is simply referred to as a word line WL. In addition, if the select gate lines SGD0 to SGD4 are not distinguished, each of the select gate lines SGD0 to SGD4 is simply referred to as a select gate line SGD.

Different column addresses are assigned to the bit lines BL0 to BL(m−1). Each bit line BL is shared by the NAND strings NS to which the same column address is assigned among the blocks BLK. The word lines WL0 to WL7 are provided for each block BLK. The source line SL is shared among the blocks BLK, for example.

A set of the memory cell transistors MT coupled to the common word line WL in one string unit SU is referred to as a cell unit CU, for example. The storage capacity of the cell unit CU including the memory cell transistors MT each storing 1-bit data is defined as "1-page data", for example. The cell unit CU can have a storage capacity of 2-page data or more according to the number of bits of data stored in the memory cell transistors MT.

Note that the circuit configuration of the memory cell array 10 is not limited to the configuration described above. For example, the number of string units SU included in each block BLK may be any number. The number of the memory cell transistors MT and the numbers of the select transistors ST1 and ST2 included in each NAND string NS may be any number.

Figure 4:
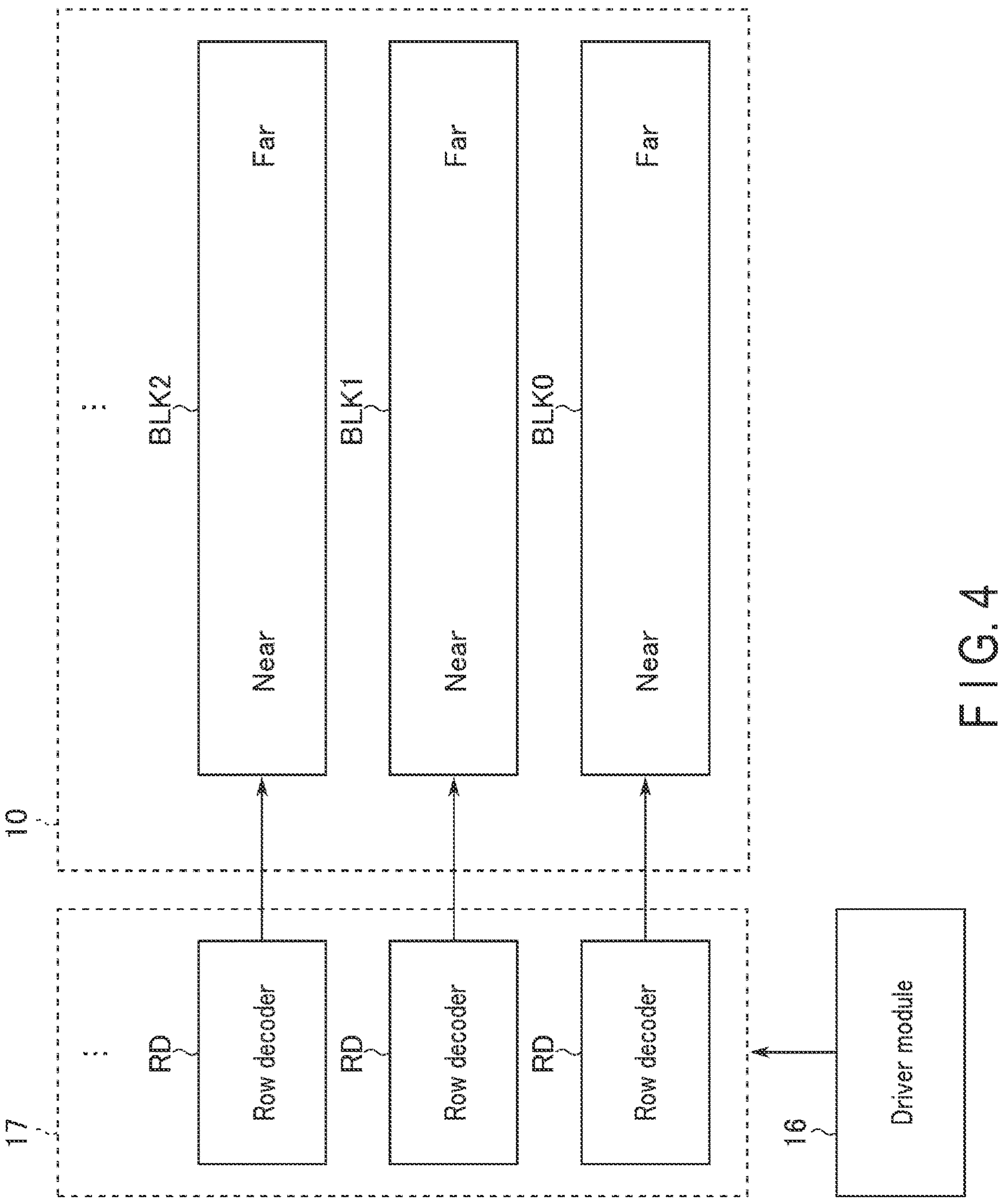
FIG. 4 is a block diagram showing configurations of the memory cell array, a driver module, and a row decoder module of the semiconductor memory device according to the embodiment.

1.1.5 Configurations of Memory Cell Array, Driver Module, and Row Decoder Module Next, a coupling relationship between the memory cell array 10, the driver module 16, and the row decoder module 17 will be described with reference to FIG. 4. FIG. 4 is a block diagram showing configurations of the memory cell array, the driver module, and the row decoder module of the semiconductor memory device according to the embodiment.

The row decoder module 17 includes a plurality of row decoders RD. The row decoders RD corresponds to respective blocks BLK.

A voltage is supplied from the driver module 16 to each block BLK via the row decoder RD corresponding to the block BLK.

Each block BLK is provided with a Near side region and a Far side region based on a positional relationship with, for example, the row decoder RD corresponding to the block BLK and the driver module 16. In each block BLK, the memory cell transistor MT included in the Near side region is located closer to the row decoder RD corresponding to the block BLK and the driver module 16 than the memory cell transistor MT included in the Far side region. More specifically, in each block BLK, the wiring length between the memory cell transistor MT included in the Near side region and the row decoder RD and the driver module 16 are configured to be shorter than the wiring length between the memory cell transistor MT included in the Far side region and the row decoder RD and the driver module 16.

The blocks BLK and the row decoders RD, for example, a plurality of sets each including one block BLK and one row decoder RD is arranged along a direction away from the driver module 16. In the example shown in FIG. 4, the wiring length between the block BLK0 and the driver module 16, the wiring length between the BLK1 and the driver module 16, the wiring length between the BLK2 and the driver module 16, . . . are arranged in this order so as to be longer. Note that the wiring length between each block BLK and the driver module 16 can be, for example, the wiring length between the NAND string NS closest to the Near side in the block BLK and the driver module 16.

1.1.6 Structure of Memory Cell Array

Next, a structure of the memory cell array 10 will be described. Note that, in the drawings referred to below, the X direction corresponds to the extending direction of the word line WL. The Y direction corresponds to the extending direction of the bit line BL. The Z direction corresponds to the vertical direction with respect to the surface of a semiconductor substrate used to form the semiconductor memory device 1. In a plan view, hatching is appropriately added for easy viewing of the drawing. The hatching added to the plan view is not necessarily related to a material or a characteristic of the component to which the hatching is added. In a cross-sectional view, the configuration is appropriately omitted for easy viewing of the drawing. The configuration shown in each drawing is appropriately simplified and shown.

1.1.6.1 Planar Structure

Figure 5:
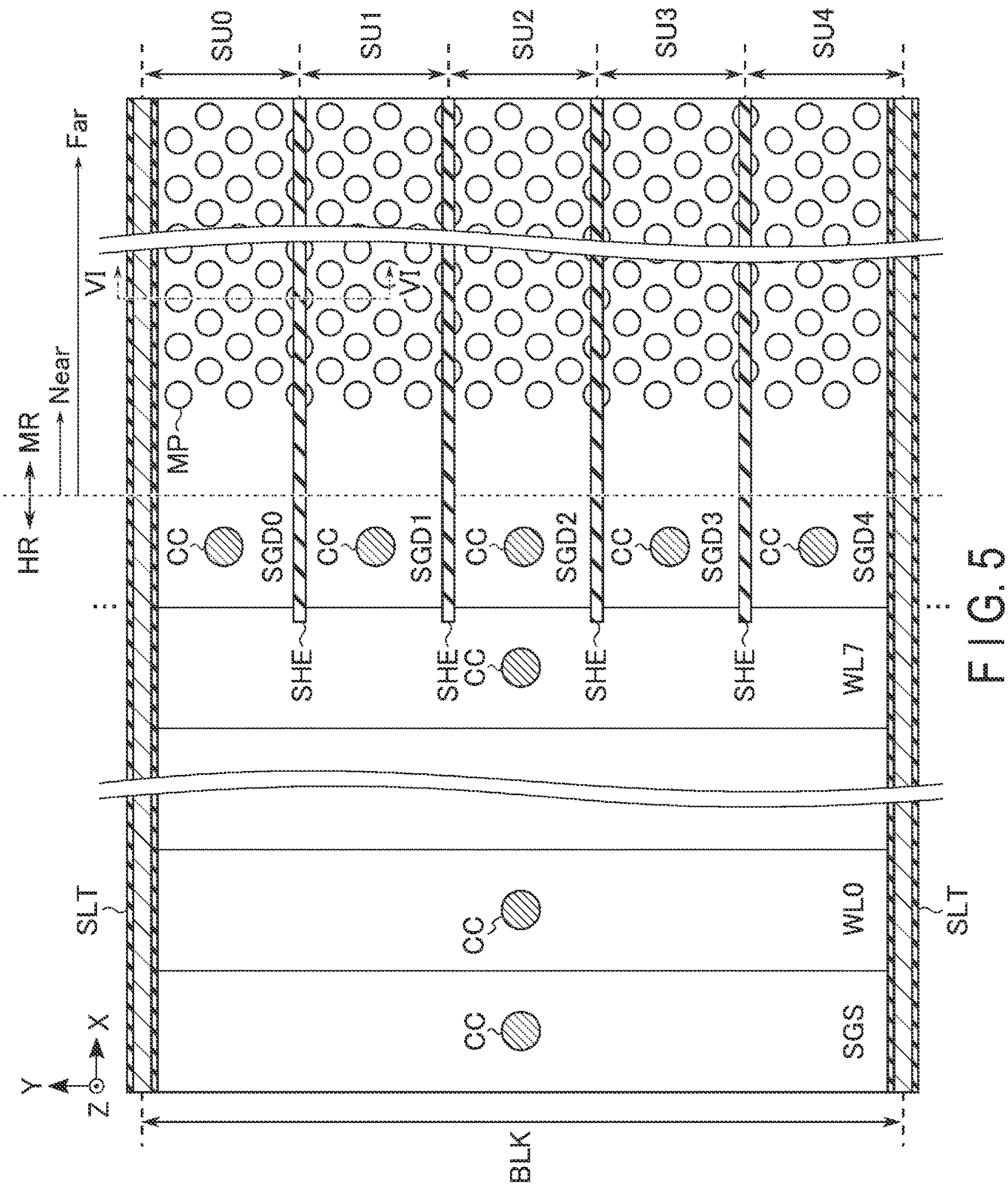
FIG. 5 is a plan view showing an example of a planar layout of the memory cell array of the semiconductor memory device according to the embodiment.

A planar structure of the memory cell array 10 will be described with reference to FIG. 5. FIG. 5 is a plan view showing an example of a planar layout of the memory cell array of the semiconductor memory device according to the embodiment. In FIG. 5, a region corresponding to one block BLK is shown.

The memory cell array 10 includes a stacked wiring structure, a plurality of memory pillars MP, a plurality of contacts CC, and a plurality of members SLT and SHE.

The stacked wiring structure is a structure stacked along the Z direction according to the select gate lines SGD and SGS and the word lines WL0 to WL7. The stacked wiring structure includes the select gate lines SGD and SGS and the word lines WL0 to WL7. In the following description, each of the select gate lines SGD and SGS and the word lines WL0 to WL7 is also simply referred to as a stacked wiring. Each stacked wiring extends in the X direction.

The stacked wiring structure is divided into, for example, a memory region MR and an extraction region HR. The memory region MR and the extraction region HR are arranged in the X direction. Note that, in the following description, the extraction region HR side of the memory region MR and the extraction region HR is referred to as one end side along the X direction. In addition, the memory region MR side of the memory region MR and the extraction region HR is referred to as the other end side along the X direction.

The memory region MR is a region in which data is substantially stored. The memory region MR is provided with the memory pillars MP.

The extraction region HR is a region used to couple the stacked wirings to the row decoder module 17 and the like. The extraction region HR is provided with the contacts CC.

Each member SLT extends in the X direction. Each member SLT traverses the stacked wiring structure in the X direction across the memory region MR and the extraction region HR. The members SLT are arranged in the Y direction. Each member SLT divides the adjacent stacked wirings via the member SLT. Each of the regions divided by the members SLT corresponds to one block BLK. Each member SLT has, for example, a structure in which an insulator and a plate-like contact are embedded.

Each member SHE extends in the X direction. Each member SHE traverses the stacked wiring structure in the X direction across the memory region MR. The members SHE are arranged in the Y direction. Each member SHE has, for example, a structure in which an insulator is embedded. Each member SHE divides the adjacent select gate lines SGD via the member SHE, for example. Each of the regions divided by the members SLT and SHE corresponds to one string unit SU.

In the following description, the string unit SU0 side of the five string units SU in each block BLK is referred to as one end side in the Y direction. In addition, the string unit SU4 side of the five string units SU in each block BLK is referred to as the other end side in the Y direction.

In the extraction region HR, the select gate lines SGS and SGD and the word lines WL0 to WL7 have a plurality of terrace portions that do not overlap the upper conductor layer.

The terrace portions are provided with the contacts CC. Each of the contacts CC is electrically coupled to the row decoder module 17. Accordingly, voltages are supplied to the select gate lines SGS and SGD and the word lines WL0 to WL7 via the contacts CC.

In the memory region MR, each memory pillar MP functions as one NAND string NS, for example. With such a configuration, the memory cell array 10 stores data. The blocks BLK include a plurality of columns of memory pillars MP arranged in the Y direction. In each column of memory pillars MP, the memory pillars MP are arranged in the X direction. In the example shown in FIG. 5, in each block BLK, 24 columns of memory pillars MP are arranged in the Y direction, for example. The memory pillars MP are arranged in a staggered manner, for example. In addition, the memory pillars MP are provided such that the members SHE overlap the memory pillars MP of the fifth, tenth, fifteenth, and twentieth columns counted from the one end side in the Y direction, for example.

With such a configuration described above, in the memory region MR of each block BLK extending in the X direction, each memory pillar MP on the one end side along the X direction is provided at a position physically closer to the contacts CC coupled to the row decoder module 17 than the memory pillar MP provided on the other end side along the X direction with respect to the memory pillar MP. For this reason, in the memory region MR of each block BLK, the one end side and the other end side along the X direction can be referred to as a Near side and a Far side, respectively. In addition, with such a configuration, the memory region MR of each block BLK includes a Near side region and a Far side region arranged side by side in this order from the one end side to the other end side along the X direction, for example. In each block BLK, the number of memory cell transistors MT included in each of the Near side region and the Far side region may be equal or different.

In the memory cell array 10, the planar layout as described above is repeatedly arranged in the Y direction.

Note that the planar layout of the memory cell array 10 is not limited to the layout described above. For example, the number of members SHE arranged between the adjacent members SLT can be designed to be any number according to the number of string units SU. In addition, the number and arrangement of the memory pillars MP in each block BLK are not limited to the configuration described with reference to FIG. 5, and can be appropriately changed.

1.1.6.2 Cross-sectional Structure

Next, a cross-sectional structure of the memory cell array 10 will be described.

Figure 6:
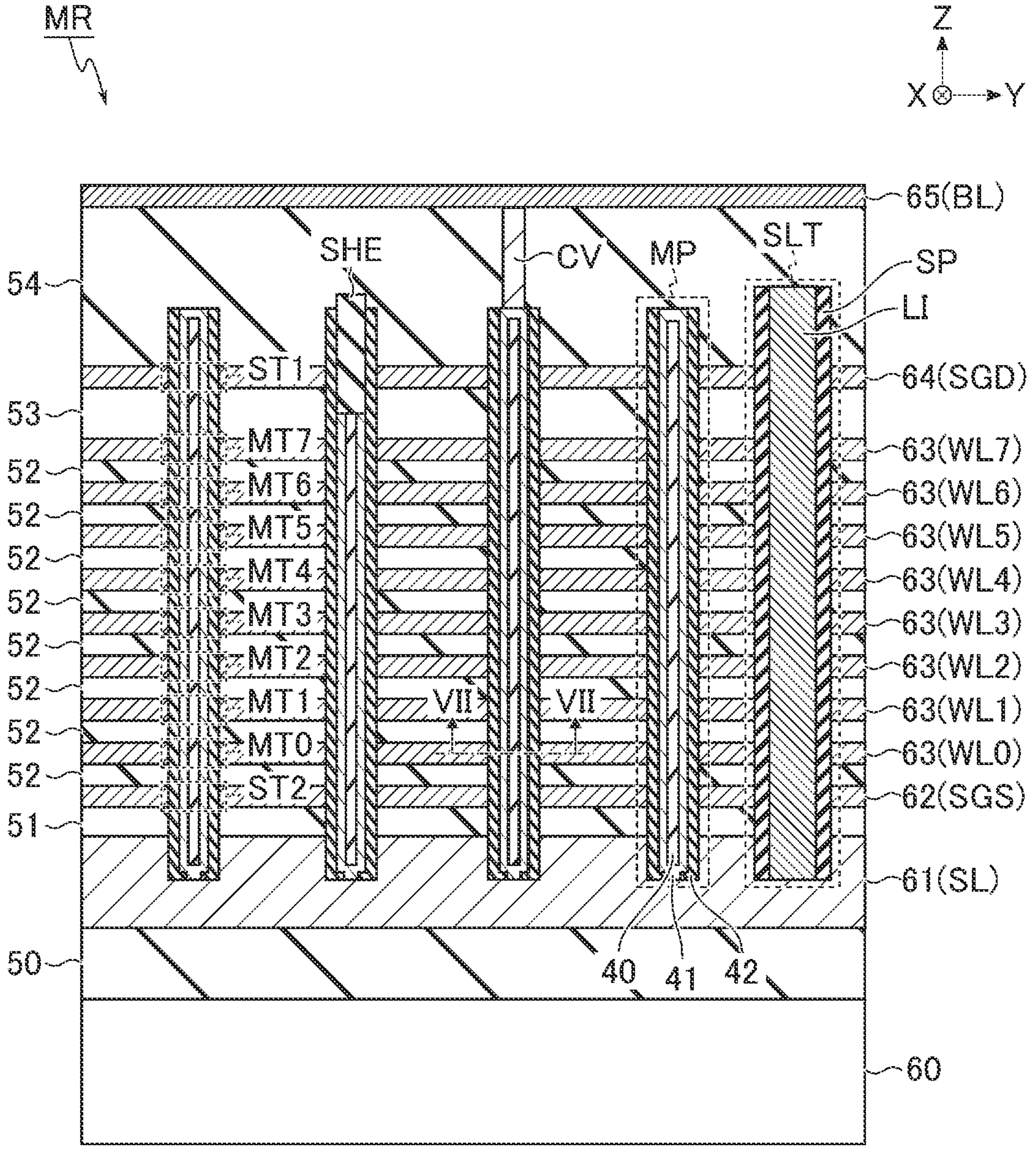
FIG. 6 is a cross-sectional view taken along line VI-VI in FIG. 5, showing an example of a cross-sectional structure of the memory cell array of the semiconductor memory device according to the embodiment.

A cross-sectional structure of the memory cell array 10 according to the embodiment will be described with reference to FIG. 6. FIG. 6 is a cross-sectional view taken along line VI-VI in FIG. 5, showing an example of a cross-sectional structure of the memory cell array of the semiconductor memory device according to the embodiment. FIG. 6 shows an example of a cross-sectional structure of the memory cell array 10 along the YZ plane.

The memory cell array 10 further includes a semiconductor substrate 60, conductor layers 61 to 65, and insulator layers 50 to 54.

More specifically, the insulator layer 50 is provided on the semiconductor substrate 60. The insulator layer 50 includes circuits, which are not shown, such as the row decoder module 17 and the sense amplifier module 18. Note that, in the present specification, a direction in which the memory cell array 10 is provided with respect to the semiconductor substrate 60 is defined as an upward direction.

The conductor layer 61 is provided on the insulator layer 50. The conductor layer 61 is formed in a plate shape extending along the XY plane, for example. The conductor layer 61 is used as the source line SL. The conductor layer 61 includes, for example, phosphorus-doped silicon.

The insulator layer 51 is provided on the conductor layer 61. The conductor layer 62 is provided on the insulator layer 51. The conductor layer 62 is formed in a plate shape extending along the XY plane, for example. The conductor layer 62 is used as the select gate line SGS. The conductor layer 62 contains, for example, tungsten.

A plurality of insulator layers 52 and a plurality of conductor layers 63 are stacked on the conductor layer 62. The insulator layers 52 and the conductor layers 63 are stacked in the order of the insulator layer 52, the conductor layer 63, the insulator layer 52, . . . , the conductor layer 63, the insulator layer 52, and the conductor layer 63, in the upward direction. The conductor layers 63 are each formed in a plate shape extending along the XY plane, for example. The stacked conductor layers 63 are used as the word lines WL0 to WL7 in order from the semiconductor substrate 60 side. The conductor layers 63 contain, for example, tungsten.

The insulator layer 53 is provided on the uppermost conductor layer 63. The conductor layer 64 is provided on the insulator layer 53. The conductor layer 64 is formed in a plate shape extending along the XY plane, for example. The conductor layer 64 is used as the select gate line SGD. The conductor layer 64 contains, for example, tungsten.

The insulator layer 54 is provided on the conductor layer 64. A plurality of conductor layers 65 is provided on the insulator layer 54. Each conductor layer 65 is formed in a line shape extending in the Y direction, for example. Each conductor layer 65 is used as the bit line BL. The conductor layers 65 contain, for example, copper.

Each of the memory pillars MP is provided to extend along the Z direction, and passes through the insulator layers 51 to 53 and the conductor layers 62 to 64. The bottom portion of the memory pillar MP is in contact with the conductor layer 61. A portion where the memory pillar MP intersects the conductor layer 62 functions as the select transistor ST2. A portion where the memory pillar MP intersects one conductor layer 63 functions as one memory cell transistor MT. A portion where the memory pillar MP intersects the conductor layer 64 functions as the select transistor ST1.

In addition, each of the memory pillars MP includes, for example, a core member 40, a semiconductor layer 41, and a stacked film 42. The core member 40 is provided to extend along the Z direction. An upper end of the core member 40 is positioned above the conductor layer 64, for example. A lower end of the core member 40 is positioned below the conductor layer 62, for example. The semiconductor layer 41 covers the periphery of the core member 40. In a lower portion of the memory pillar MP, a part of the semiconductor layer 41 is in contact with the conductor layer 61. The stacked film 42 covers the side surface and the bottom surface of the semiconductor layer 41 except for the portion where the semiconductor layer 41 is in contact with the conductor layer 61. The core member 40 contains, for example, an insulator such as silicon oxide. The semiconductor layer 41 contains, for example, silicon.

A columnar contacts CV is provided on the upper surface of the semiconductor layer 41 in the memory pillar MP. In the shown region, one contact CV corresponding to one memory pillar MP among the three memory pillars MP is shown. In the memory region MR, the contact CV is coupled to the memory pillar MP that does not overlap the member SHE and is not coupled to the contact CV, in a region not shown.

The upper surface of the contact CV is electrically coupled to one conductor layer 65. The contact CV is provided such that one contact CV is coupled to one conductor layer 65 in each space divided by the members SLT and SHE. That is, one memory pillar MP included in each string unit SU is electrically coupled to each of the conductor layers 65.

The member SLT has a portion provided, for example, along the XZ plane, and divides the conductor layers 62 to 64.

The member SHE has a portion provided, for example, along the XZ plane, and divides the conductor layer 64. The lower surface of the member SHE is positioned between the uppermost conductor layer 63 and the conductor layer 64. The member SHE contains, for example, an insulator such as silicon oxide.

1.1.7 Structure of Memory Pillar

Figure 7:
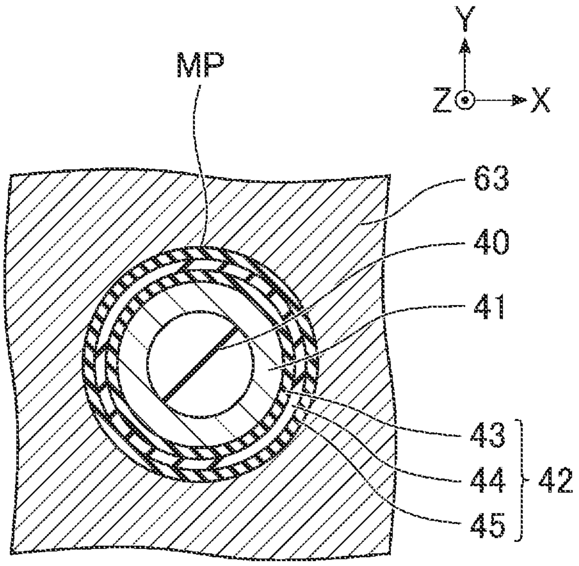
FIG. 7 is a cross-sectional view taken along line VII-VII in FIG. 6, showing an example of a cross-sectional structure of a memory pillar included in the memory cell array of the semiconductor memory device according to the embodiment.

A structure of the memory pillar MP in the semiconductor memory device 1 according to the embodiment will be described with reference to FIG. 7. FIG. 7 is a cross-sectional view taken along line VII-VII in FIG. 6, showing an example of a cross-sectional structure of a memory pillar included in the memory cell array of the semiconductor memory device according to the embodiment.

The stacked film 42 includes, for example, a tunnel insulating film 43, an insulating film 44, and a block insulating film 45.

In a cross section including the conductor layer 63, the core member 40 is provided at the central portion of the memory pillar MP. The core member 40 has, for example, a circular shape on the XY plane. The semiconductor layer 41 surrounds the side surface of the core member 40. The tunnel insulating film 43 surrounds the side surface of the semiconductor layer 41. The insulating film 44 surrounds the side surface of the tunnel insulating film 43. The block insulating film 45 surrounds the side surface of the insulating film 44. The conductor layer 63 surrounds the side surface of the block insulating film 45. Each of the tunnel insulating film 43 and the block insulating film 45 contains, for example, silicon oxide. The insulating film 44 contains, for example, silicon nitride.

With such a configuration described above, the memory pillar MP has, for example, a circular shape in the XY plane.

In the memory pillar MP described above, the semiconductor layer 41 functions as a current path for the memory cell transistors MT0 to MT7 and the select transistors ST1 and ST2. In addition, the insulating film 44 is used as a charge storage layer of the memory cell transistor MT. The semiconductor memory device 1 causes a current to flow in the memory pillar MP between the bit line BL and the source line SL by causing the memory cell transistors MT0 to MT7 and the select transistors ST1 and ST2 to be in an ON state.

1.1.8 Operation Mode Information

Next, the operation mode information 30 that can be stored in the semiconductor memory device 1 and the volatile memory 3 will be described.

In the embodiment, the semiconductor memory device 1 is configured to be capable of executing the write operation and read operation in which the normal mode or the high-speed mode is applied. More specifically, the semiconductor memory device 1 is configured to perform the write operation and read operation in which the high-speed mode is applied to a specific block BLK. In addition, the semiconductor memory device 1 is configured to perform the write operation and read operation in which the normal mode is applied to the other blocks BLK except for the specific block BLK.

When the read operation is executed for the block BLK to which the high-speed mode is applied, at least one NAND string NS in the block BLK is caused to be in an inhibited state. In the specific block BLK, the NAND strings NS other than the NAND string NS caused to be in the inhibited state are caused to be in an operable state. The inhibit state is a state in which writing or reading of data into or from the memory cell transistors MT included in the NAND string NS having this state is not executed. The operable state is a state in which writing or reading of data into or from the memory cell transistors MT included in the NAND strings NS having this state can be executed.

In the embodiment, for example, in the read operation for the block BLK to which the high-speed mode is applied, all the NAND strings NS coupled to at least one bit line BL are caused to be in the inhibited state. The bit line BL coupled to the NAND strings NS caused to be in the inhibited state is included in, for example, the Far side region. In addition, the bit line BL coupled to the NAND strings NS caused to be in the inhibited state may include, for example, all the bit lines BL included in the Far side region. The bit lines BL coupled to the NAND strings NS caused to be in the inhibited state are determined in advance for each block BLK to which the high-speed mode is applied, for example.

In the block BLK to which the normal mode is applied, the write operation and the read operation can be performed for all the memory cell transistors MT in the block BLK.

Note that, in the following description, ("INH") is added to the end of the reference sign of the configuration related to the NAND strings NS caused to be in the inhibited state during the read operation for the block BLK to which the high-speed mode is applied. In addition, ("PRM") is added to the end of the reference sign of the configuration related to the other NAND strings NS caused to be in the operable state during the read operation for the block BLK to which the high-speed mode is applied.

The operation mode information 30 will be described with reference to FIG. 8. FIG. 8 is a diagram showing an example of the operation mode information in the embodiment.

The operation mode information 30 stores information regarding which operation mode, the normal mode or the high-speed mode, is applied to each block BLK during the write operation and the read operation. For example, in FIG. 8, the operation mode information 30 stores that the high-speed mode is applied to the blocks BLK0 and BLK1. In addition, the operation mode information 30 stores that the normal mode is applied to the blocks BLK2, . . . , BLK(n−2), and BLK(n−1).

Note that, in the example shown in FIG. 8, the high-speed mode is applied to two blocks BLK, but is not limited thereto. The number of blocks BLK to which the high-speed mode is applied may be one, or three or more.

In addition, the block BLK to which the high-speed mode is applied may be selected based on the wiring length, for example. More specifically, the block BLK to which the high-speed mode is applied may be selected from, for example, the blocks BLK whose wiring length between each block BLK and the driver module 16 is equal to or less than a predetermined length. In addition, the block BLK to which the high-speed mode is applied may be, for example, all the blocks BLK having the wiring lengths equal to or less than the predetermined length.

Figure 9:
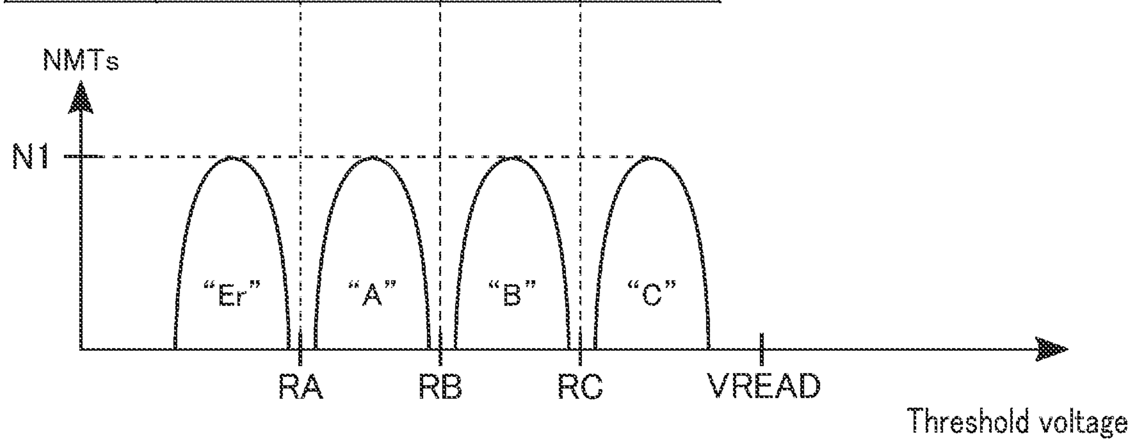
FIG. 9 is a schematic diagram showing an example of a threshold voltage distribution of memory cell transistors in a block, to which a normal mode is applied, included in the memory cell array of the semiconductor memory device according to the embodiment.

1.1.9 Threshold Voltage Distribution of Memory Cell Transistors in Block to which Normal Mode is Applied The threshold voltage distribution of the memory cell transistors MT when the read operation is executed for the block BLK to which the normal mode is applied in the embodiment will be described with reference to FIG. 9. FIG. 9 is a schematic diagram showing an example of a threshold voltage distribution of the memory cell transistors in the block, to which the normal mode is applied, included in the memory cell array of the semiconductor memory device according to the embodiment. In the threshold voltage distribution shown in FIG. 9, the horizontal axis corresponds to the threshold voltage of the memory cell transistors MT. The vertical axis corresponds to the number of memory cell transistors MT. In FIG. 9, the number of memory cell transistors MT is indicated as a value NMTs.

In the semiconductor memory device 1 according to the embodiment, in the block BLK to which the normal mode is applied, four states are formed by threshold voltages of the memory cell transistors MT, for example. In the following, the four states are referred to as an "Er" state, an "A" state, a "B" state, and a "C" state in order from a lower threshold voltage.

The "Er" state is equivalent to, for example, a data erase state. The threshold voltage of the memory cell transistors MT included in the "Er" state is less than a voltage RA.

The "A" state, the "B" state, and the "C" state are equivalent to a state in which charges are injected into the charge storage layers of the memory cell transistors MT. The threshold voltage of the memory cell transistors MT included in the "A" state is equal to or greater than the voltage RA and less than a voltage RB (RB>RA). The threshold voltage of the memory cell transistors MT included in the "B" state is equal to or greater than the voltage RB and less than a voltage RC (RC>RB). The threshold voltage of the memory cell transistors MT included in the "C" state is equal to or greater than the voltage RC and less than a voltage VRAED (VREAD>RC). The voltage VREAD is a voltage that causes the memory cell transistors MT to be in the ON state in the case where the voltage is supplied to the control gates of the memory cell transistors MT even if the memory cell transistors MT are in any of the "Er" state to the "C" state.

If a voltage is supplied to the control gate, the memory cell transistor MT is in the ON state in a case where the memory cell transistor MT has a threshold voltage less than the supplied voltage. If a voltage is supplied to the control gate, the memory cell transistor MT is in an OFF state in a case where the memory cell transistor MT has a threshold voltage equal to or greater than the supplied voltage.

The four types of threshold voltage distribution of the memory cell transistors MT described above are assigned different 2-bit data. In the following, an example of data assignment to the threshold voltage distribution is listed. In the following, data assigned to each state is indicated in the order of "high-order bit" and "low-order bit" corresponding to the state.

"Er" state: "1, 1" data
"A" state: "0, 1" data
"B" state: "0, 0" data
"C" state: "1, 0" data The number of memory cell transistors MT included in each of the "Er" state, the "A" state, the "B" state, and the "C" state is substantially equal, for example. Accordingly, the maximum value of the number of memory cell transistors MT in each state in the threshold voltage distribution of the block BLK to which the normal mode is applied is substantially equal to a value N1, for example. Note that, in the following description, the maximum value of the magnitude of each state on the vertical axis of the threshold voltage distribution is simply referred to as a height of each state.

Figure 10:
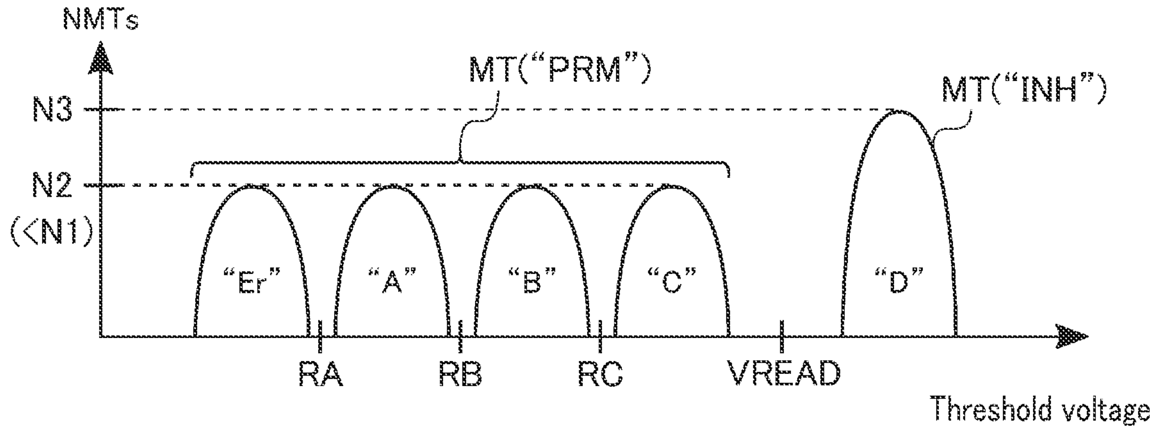
FIG. 10 is a schematic diagram showing an example of a threshold voltage distribution of memory cell transistors in a block, to which a high-speed mode is applied, included in the memory cell array of the semiconductor memory device according to the embodiment.

1.1.10 Threshold Voltage Distribution of Memory Cell Transistors in Block to which High-Speed Mode is Applied Next, the threshold voltage distribution of the memory cell transistors MT when the read operation is executed for the block BLK to which the high-speed mode is applied in the embodiment will be described with reference to FIG. 10. FIG. 10 is a schematic diagram showing an example of a threshold voltage distribution of the memory cell transistors in the block, to which the high-speed mode is applied, included in the memory cell array of the semiconductor memory device according to the embodiment. In the threshold voltage distribution shown in FIG. 10, the horizontal axis corresponds to the threshold voltage of the memory cell transistors MT. The vertical axis corresponds to the number of memory cell transistors MT. In FIG. 10, the number of memory cell transistors MT is indicated as a value NMTs.

In the following, the threshold voltage distribution of the memory cell transistors MT when the read operation is performed for the block BLK to which the high-speed mode is applied is described mainly in terms of the differences from the threshold voltage distribution of the memory cell transistors MT when the read operation is performed for the block BLK to which the normal mode is applied.

In the semiconductor memory device 1 according to the embodiment, in the block BLK to which the high-speed mode is applied, a "D" state is formed in addition to the above-described "Er" state, "A" state, "B" state, and "C" state by the threshold voltages of the memory cell transistors MT, for example.

The threshold voltage of the memory cell transistors MT included in the "D" state is equal to or greater than the voltage VREAD, for example. In the embodiment, an example in a case where all the memory cell transistors MT ("INH") included in the block BLK have the "D" state when the write operation and the read operation are executed for the block BLK to which the high-speed mode is applied is shown. In addition, each memory cell transistor MT ("PRM") included in the block BLK has any one of the "Er" state to the "D" state when the write operation and the read operation are executed for the block BLK to which the high-speed mode is applied. That is, in the block BLK, each memory cell transistor MT ("PRM") may have a state in which data is written.

With such a configuration described above, in the block BLK to which the high-speed mode is applied, the height of each of the "Er" state, the "A" state, the "B" state, and the "C" state in the threshold voltage distribution is substantially equal to a value N2 that is less than the value N1, for example. In addition, the height of the "D" state is a value N3, for example. Note that FIG. 10 shows a case where the value N3 is greater than the value N2, but is not limited thereto. The value N3 may be equal to or less than the value N2.

1.1.11 Threshold Voltage Distribution of Select Transistors

Figure 11:
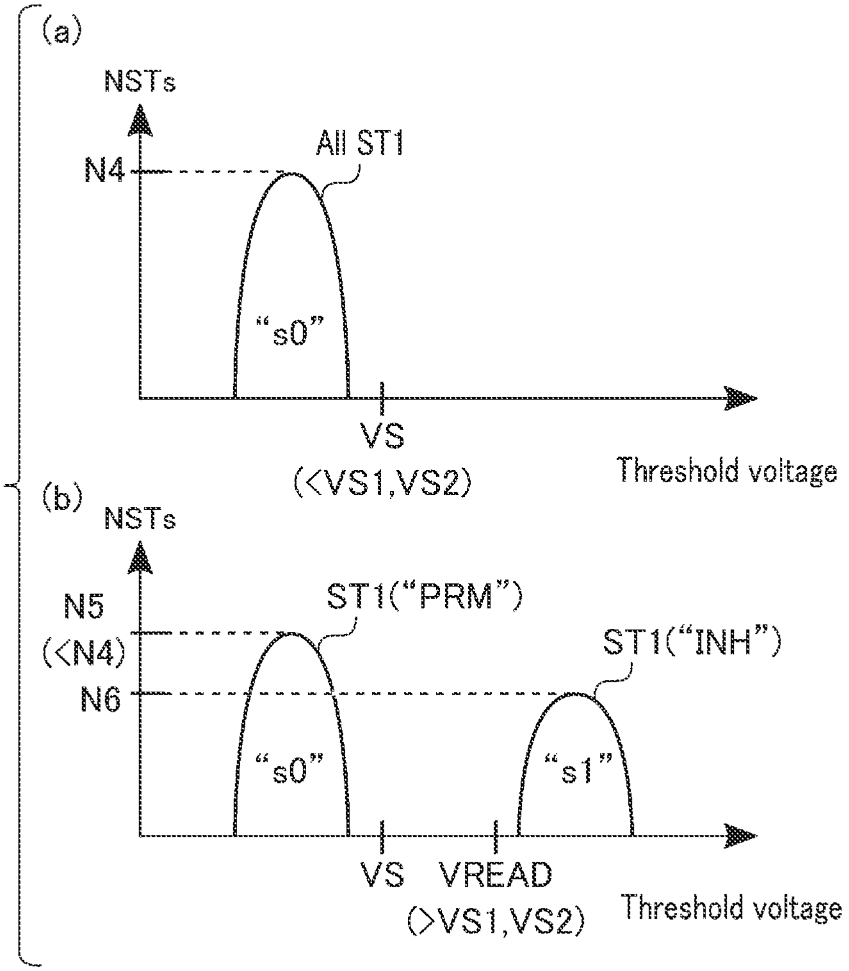
FIG. 11 is a schematic diagram showing examples of threshold voltage distributions of select transistors included in the memory cell array of the semiconductor memory device according to the embodiment.

Next, a threshold voltage distribution of the select transistors ST1 in the embodiment will be described with reference to FIG. 11. FIG. 11 is a schematic diagram showing examples of threshold voltage distributions of the select transistors included in the memory cell array of the semiconductor memory device according to the embodiment. FIG. 11 shows an example of the threshold voltage distribution of the select transistors ST1 when the read operation is executed for the block BLK to which the normal mode is applied. In addition, FIG. 11 (*b*) shows an example of the threshold voltage distribution of the select transistors ST1 when the read operation is executed for the block BLK to which the high-speed mode is applied. In the threshold voltage distributions shown in FIG. 11, the horizontal axis corresponds to the threshold voltages of the select transistors ST1. The vertical axis corresponds to the number of select transistors ST1. In FIG. 11, the number of select transistors ST1 is indicated as a value NSTs.

As shown in FIG. 11 (*a*), in the threshold voltage distribution when the read operation is executed for the block BLK to which the normal mode is applied, only an "s0" state is formed. The threshold voltage of the select transistors ST1 included in the "s0" state is less than a voltage VS. The voltage VS is a voltage less than voltages VS1 and VS2. The voltages VS1 and VS2 are voltages supplied to the select gate line SGD in the write operation and the read operation, respectively. The voltages VS1 and VS2 are voltages less than the voltage VREAD, for example. Accordingly, in a case where the voltages VS1 and VS2 are supplied to the control gate of each select transistor ST1 included in the "s1" state, the select transistor ST1 is in the ON state. In the block BLK to which the normal mode is applied, the height of the "s0" state is a value N4, for example.

As shown in FIG. 11 (*b*), in the threshold voltage distribution when the read operation is executed for the block BLK to which the high-speed mode is applied, an "s1" state is formed in addition to the "s0" state. The threshold voltage of the select transistors ST1 included in the "s1" state is equal to or greater than the voltage VREAD, for example. The threshold voltage of the select transistors ST1 included in the "s1" state may be less than a voltage less than the voltage VREAD, and may be equal to or greater than the voltages VS1 and VS2. With such a configuration described above, in a case where the voltages VS1 and VS2 are supplied to the control gate of each select transistor ST1 included in the "s1" state, the select transistor ST1 is in the OFF state. In the embodiment, when the read operation is executed for the block BLK to which the high-speed mode is applied, the select transistors ST1 ("PRM") coupled to the bit line BL ("PRM") have the "s0" state. In addition, in the embodiment, when the read operation is executed for the block BLK to which the high-speed mode is applied, the select transistors ST1 ("INH") coupled to the bit line BL ("INH") have the "s1" state. In FIG. 11 (*b*), the height of the "s0" state is a value N5 less than the value N4, for example. The height of the "s1" state is a value N6, for example. Note that FIG. 11 (*b*) shows a case where the value N6 is less than the value N5, but is not limited thereto. The value N6 may be equal to or greater than the value N5.

1.2 Operation

Next, an operation using the semiconductor memory device 1 according to the embodiment will be described.

In the following description, the word line WL and the string unit SU corresponding to the memory cell transistor MT that is a target of the write operation or the read operation are referred to as a selected word line WL and a selected string unit SU, respectively. In addition, the word line WL and the string unit SU corresponding to the memory cell transistor MT that is not a target of the write operation or the read operation are referred to as an unselected word line WL and an unselected string unit SU, respectively.

In a case where the number of word lines WL included in the block BLK is eight, the number of selected word lines in the write operation or the read operation is one, and the number of unselected word lines is seven.

1.2.1 Write Operation for Block to which Normal Mode is Applied

First, an example of the write operation for the block to which the normal mode is applied in the embodiment will be briefly described.

The write operation includes a program operation, and a verify operation in the write operation. The program operation is an operation of raising the threshold voltage by injecting electrons into the charge storage layer (or of maintaining the threshold voltage by prohibiting injection). The verify operation in the write operation is an operation of reading data after the program operation to determine whether the threshold voltage of the memory cell transistor MT has reached a target voltage. The semiconductor memory device 1 raises the threshold voltage of the memory cell transistor MT to the target voltage by repeating a combination of the program operation and the verify operation in the write operation.

In the following description, description regarding the verify operation in the write operation is omitted, and an example of a case where one program operation is executed will be mainly described.

1.2.1.1 Program Operation

Figure 12:
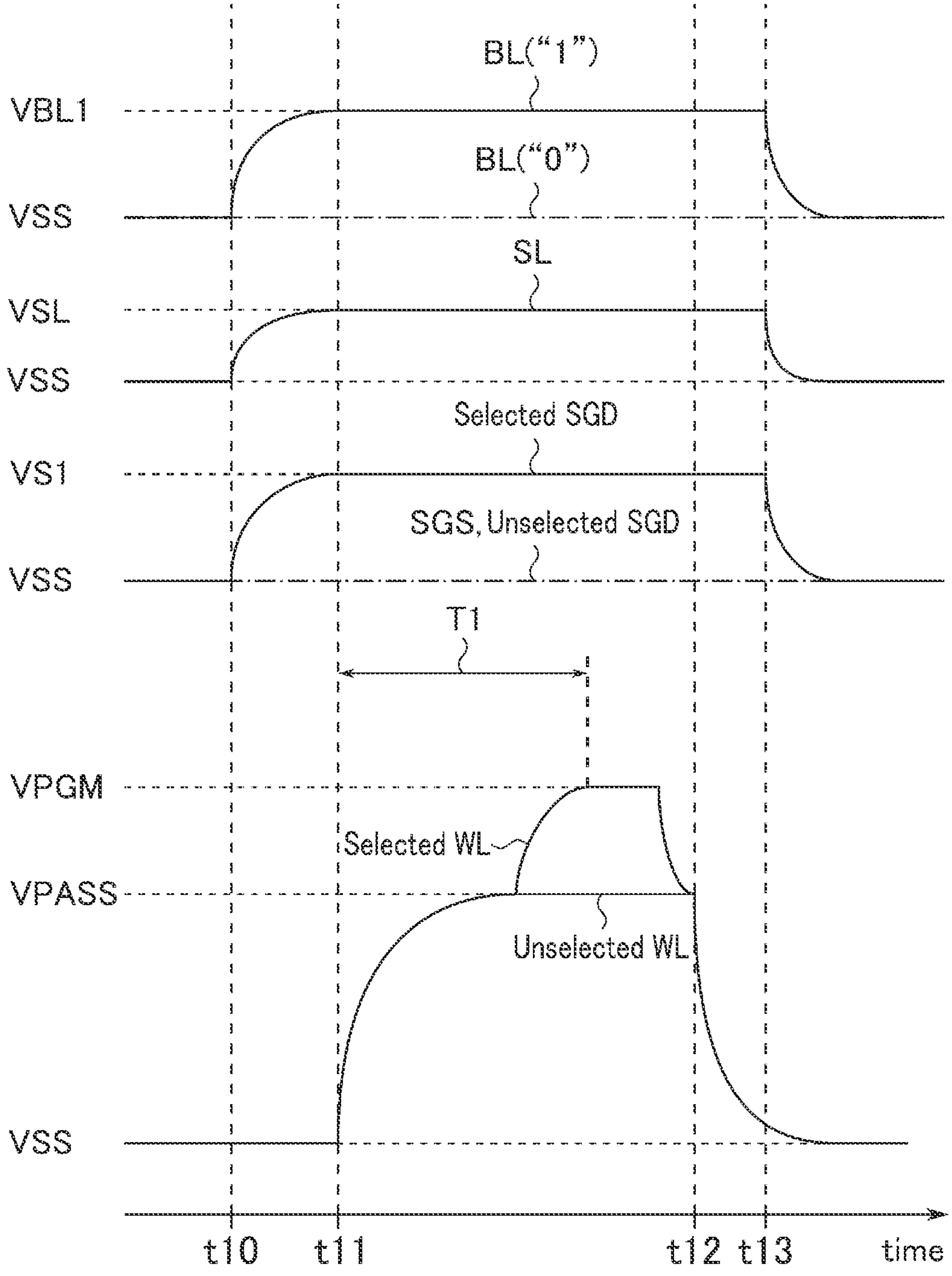
FIG. 12 is a timing chart showing examples of voltages of a bit line, a source line, a select gate line, and a word line during a program operation in a block to which the normal mode is applied using the semiconductor memory device according to the embodiment.

The program operation for the block BLK to which the normal mode is applied in the embodiment will be described with reference to FIG. 12. FIG. 12 is a timing chart showing examples of voltages of a bit line, a source line, a select gate line, and a word line during the program operation in the block to which the normal mode is applied using the semiconductor memory device according to the embodiment.

In the following, the operation of raising the threshold voltage of the memory cell transistor MT is referred to as a "0" program operation", and the operation of maintaining the threshold voltage of the memory cell transistor MT is referred to as a "1" program operation".

In the voltage of the bit line BL shown in the upper part of FIG. 12, the solid line corresponds to the bit line BL (hereinafter, a bit line BL ("1")) corresponding to the memory cell transistor MT that is the target of the "1" program operation. The long-dashed short-dashed line corresponds to a bit line BL (hereinafter, a bit line BL ("0")) corresponding to the memory cell transistor MT that is the target of the "0" program operation.

At time t10, the sense amplifier module 18 supplies a voltage VBL1 to the bit line BL ("1") to perform BL pre-charge. Meanwhile, a voltage VSS is supplied to the bit line BL ("0"). The voltage VSS is a ground voltage, for example.

In addition, the row decoder module 17 selects any block BLK among the blocks BLK. The row decoder module 17 further selects any string unit SU among the string units SU. Then, the row decoder module 17 supplies the voltage VS1 to the select gate line SGD in the selected string unit SU. Note that, in FIG. 12, the select gate line SGD in the selected string unit SU is simply referred to as a selected SGD. In addition, the row decoder module 17 supplies the voltage VSS to the select gate line SGD in the unselected string units SU. Note that, in FIG. 12, the select gate line SGD in the unselected string units SU is simply referred to as an unselected SGD. The voltage VS1 is a voltage that causes the select transistor ST1 whose bit line BL has been supplied with the voltage VSS to be in the ON state but causes the select transistor ST1 whose bit line BL has been supplied with the voltage VBL1 to be in the OFF state.

In addition, the row decoder module 17 supplies the voltage VSS to the select gate line SGS to cause the select transistor ST2 to be in the OFF state.

In addition, the driver module 16 supplies a voltage VSL (>VSS) to the source line SL.

Through the above processing, the channel of the NAND string NS corresponding to the bit line BL ("1") is in a floating state electrically insulated from the bit line BL and the source line SL. Note that, in the following description, in addition to a state of a transistor in which a current does not flow based on a threshold voltage, a state of a transistor in which a current does not flow due to being in the floating state is also referred to as the OFF state.

As described above, in the same program operation, the "0" program operation and the "1" program operation can be set for each bit line BL.

The row decoder module 17 selects any word line WL in the selected block BLK.

At time t11, the row decoder module 17 starts supplying a voltage VPGM to the selected word line WL. Accordingly, after a period T1 elapses from time t11, the voltage of the selected word line WL raises to a voltage equal to the voltage VPGM. Note that, in FIG. 12, the selected word line WL is simply referred to as a selected WL. In addition, the row decoder module 17 supplies a voltage VPASS to the other unselected word lines WL. Note that, in FIG. 12, the unselected word lines WL are simply referred to as an unselected WL.

In the NAND string NS corresponding to the bit line BL ("0"), the select transistor ST1 is in the ON state. Then, the channel potential of the memory cell transistor MT coupled to the selected word line WL is VSS. Therefore, a potential difference (VPGM−VSS) between the control gate and the channel increases. As a result, electrons are injected into the charge storage layer, and the threshold voltage of the memory cell transistor MT is raised.

In the NAND string NS corresponding to the bit line BL ("1"), the select transistor ST1 is in a cutoff state. Therefore, the channel of the memory cell transistor MT coupled to the selected word line WL is in the floating state. Then, the channel potential rises due to capacitive coupling between the channel and the word line WL or the like. Therefore, the potential difference between the control gate and the channel decreases, and as a result, electrons are scarcely injected into the charge storage layer, and the threshold voltage of the memory cell transistor MT is maintained.

At time t12, the row decoder module 17 supplies the voltage VSS to the selected word line WL and the unselected word lines WL. Accordingly, injection of charges into the charge storage layer is completed.

At time t13, the row decoder module 17 supplies the voltage VSS to the select gate line SGD.

In addition, the sense amplifier module 18 supplies the voltage VSS to the bit line BL.

In addition, the driver module 16 supplies the voltage VSS to the source line SL.

This completes the program operation.

Note that FIG. 12 is merely an example of a timing chart of the program operation according to the embodiment, and the magnitude relationship of the voltages supplied to the bit line BL, the word line WL, the source line SL, and the select gate lines SGS and SGD does not necessarily coincide with the magnitude relationship of the voltages shown in FIG. 12.

1.2.2 Read Operation for Block to which Normal Mode is Applied

Figure 13:
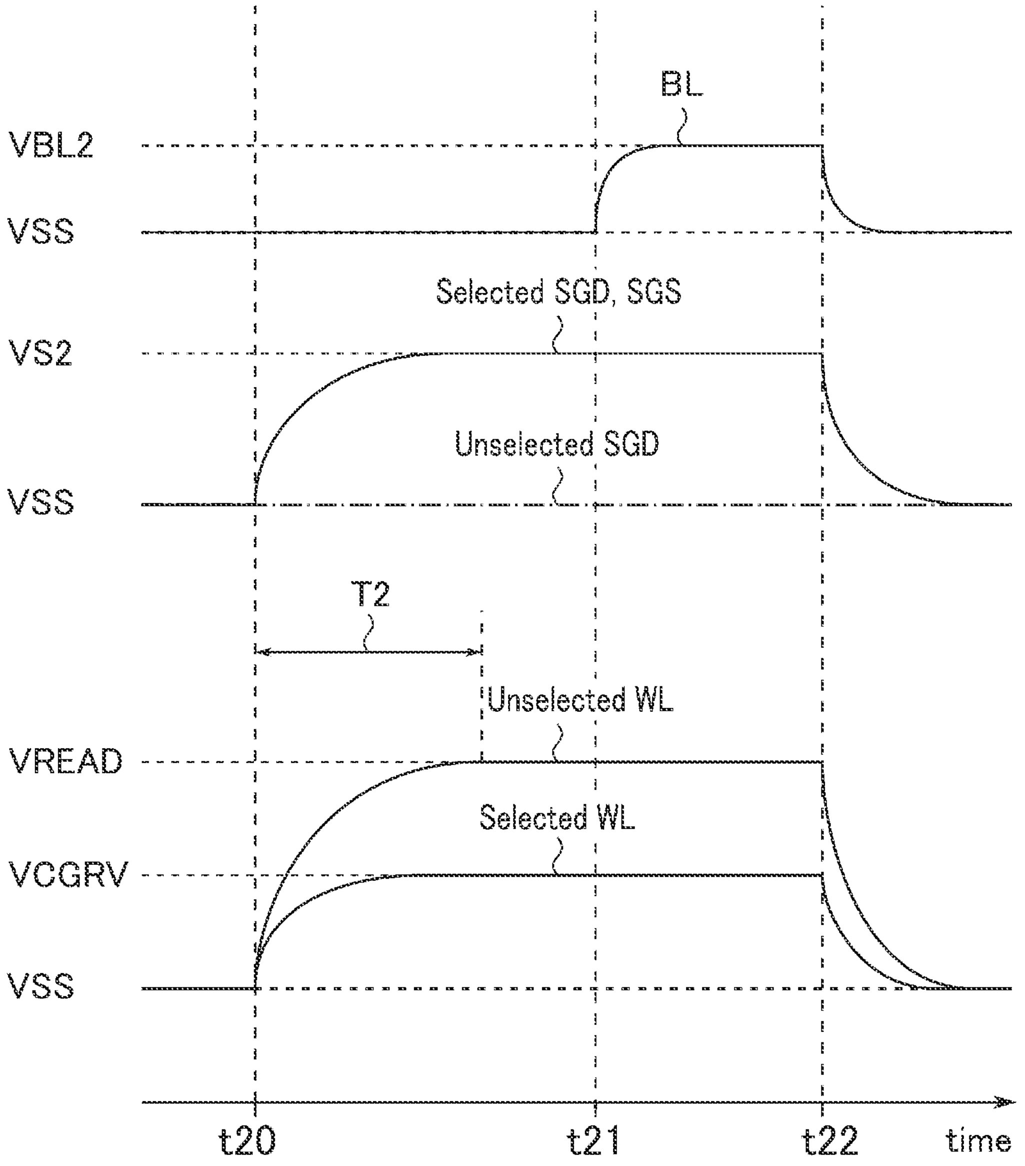
FIG. 13 is a timing chart showing examples of voltages of a bit line, a select gate line, and a word line during a read operation for a block to which the normal mode is applied using the semiconductor memory device according to the embodiment.

An example of the read operation for the block BLK to which the normal mode is applied in the embodiment will be described with reference to FIG. 13. FIG. 13 is a timing chart showing examples of voltages of a bit line, a select gate line, and a word line during the read operation for the block to which the normal mode is applied using the semiconductor memory device according to the embodiment. Note that, in the following description, a case where 1-bit data is read in one read operation will be described in order to simplify the description.

At time t20, the row decoder module 17 supplies the voltage VS2 to the select gate line SGD corresponding to the selected string unit SU. Note that, in FIG. 13, the select gate line SGD corresponding to the selected string unit SU is simply referred to as a selected SGD. In addition, the row decoder module 17 supplies the voltage VSS to the select gate line SGD corresponding to the unselected string unit SU. Note that, in FIG. 13, the select gate line SGD corresponding to the unselected string unit SU is simply referred to as an unselected SGD. In addition, the row decoder module 17 supplies a voltage equal to, for example, the voltage VS2 to the select gate line SGS. Note that the voltage supplied to the select gate line may be any voltage that causes the select transistor ST2 to be in the ON state, and may be a voltage different from the voltage VS2. Through the above processing, the select transistor ST1 and the select transistor ST2 in the selected string unit SU are in the ON state, and the select transistor ST1 in the unselected string unit SU is in the OFF state.

In addition, the row decoder module 17 starts supplying the voltage VREAD to the unselected word lines WL. Accordingly, after a period T2 has elapsed from time t20, the voltage of the unselected word lines WL rises to a voltage equal to the voltage VREAD. By supplying the voltage VREAD to the unselected word lines WL, the corresponding memory cell transistor MT is in the ON state. Note that, in FIG. 13, the unselected word lines WL are simply referred to as an unselected WL. In addition, the row decoder module 17 supplies a voltage VCGRV to the selected word line WL. The voltage VCGRV is less than the voltage VREAD (VREAD>VCGRV). The voltage VCGRV is a voltage according to the threshold voltage of the memory cell transistor MT that is the target of the read operation. More specifically, if, for example, the threshold voltage of the memory cell transistor MT that is the target of the read operation is greater than the voltage VCGRV, the memory cell transistor MT is in the OFF state, and if the threshold voltage is equal to or less than the voltage VCGRV, the memory cell transistor MT is in the ON state. Note that, in FIG. 13, the selected word line WL is simply referred to as a selected WL.

At time t21, the sense amplifier module 18 causes the potential of the bit line BL to be a voltage VBL2. The voltage VBL2 is a voltage less than the voltage VCGRV (VCGRV>VBL2), for example.

At time t22, the row decoder module 17 supplies the voltage VSS to the selected word line WL, the unselected word lines WL, the select gate lines SGD corresponding to the selected string unit SU and the unselected string unit SU, and the select gate line SGS.

In addition, the sense amplifier module 18 supplies the voltage VSS to the bit line BL.

Through the above operation, data is read from the memory cell transistor MT corresponding to the selected word line WL in the selected string unit SU.

Note that FIG. 13 is merely an example of a timing chart of the read operation according to the embodiment, and the magnitude relationship of the voltages supplied to the bit line BL, the word line WL, the source line SL, and the select gate line SGD does not necessarily coincide with the magnitude relationship of the voltages shown in FIG. 13.

1.2.3 Overall Operation when High-Speed Mode is Applied

Figure 14:
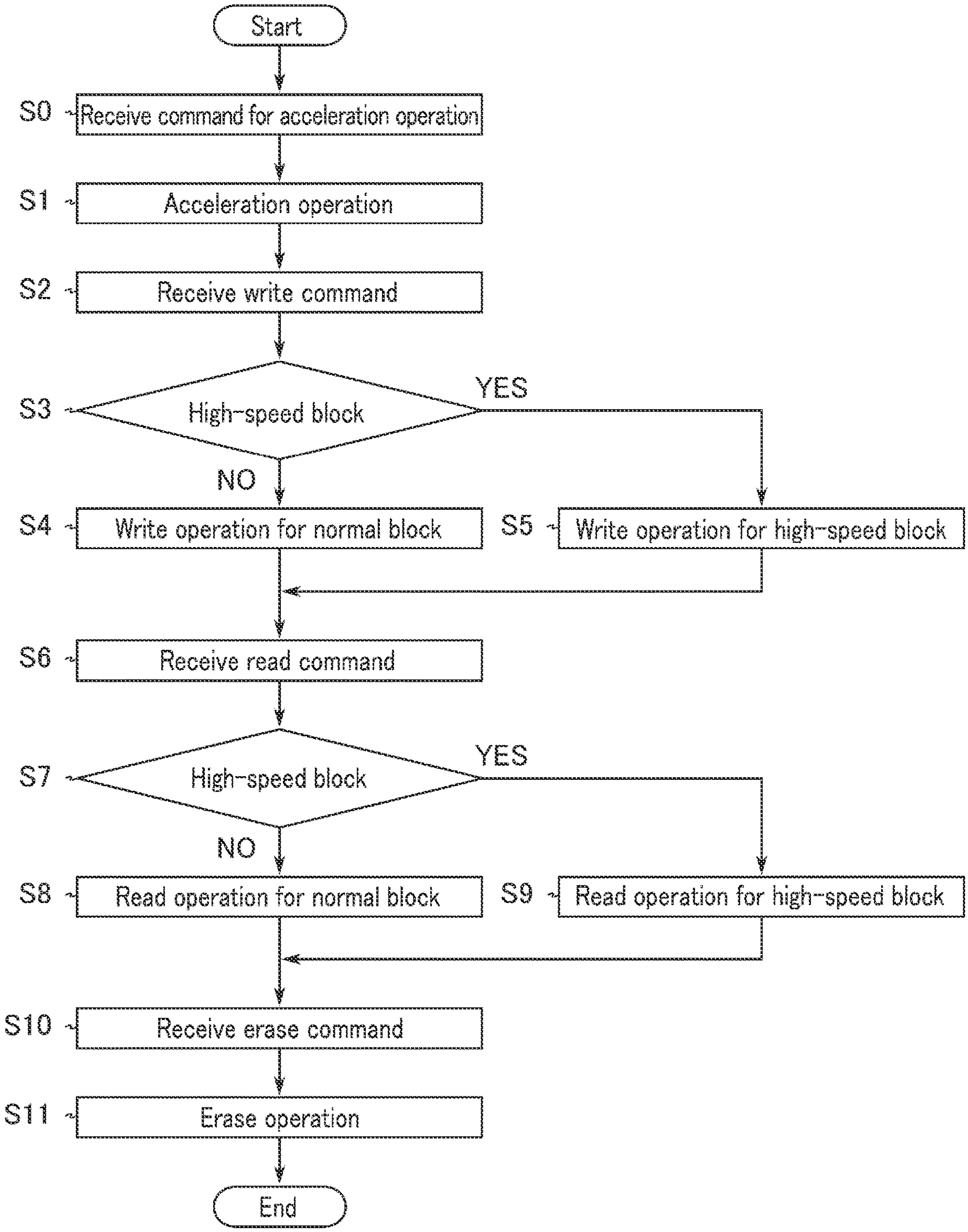
FIG. 14 is a flowchart showing an example of an overall operation when the high-speed mode is applied using the semiconductor memory device according to the embodiment.

Next, an example of the overall operation when the high-speed mode is applied will be described with reference to FIG. 14. FIG. 14 is a flowchart showing an example of the overall operation when the high-speed mode is applied using the semiconductor memory device according to the embodiment. FIG. 14 shows an example of the overall operation when, after the high-speed mode is applied to a certain block BLK, the write operation, read operation, and erase operation are executed for the block BLK or the other blocks BLK.

In S0, the semiconductor memory device 1 receives, from the memory controller 2, a command for an acceleration operation for the block BLK that is a target of the acceleration operation.

Then, in S1, the semiconductor memory device 1 executes the acceleration operation for the block BLK that is the target of the acceleration operation. Although details of the acceleration operation will be described later, by executing the acceleration operation for the block BLK, the read operation in which the high-speed mode is applied to the block BLK can be executed. That is, after the acceleration operation, in the read operation in which the high-speed mode is applied, at least one NAND string NS included in the block BLK is caused to be in the inhibited state. Note that the block BLK that is the target of the acceleration operation and the NAND string NS ("INH") are selected in advance before S0 by the memory controller 2, for example.

In addition, the operation mode corresponding to the block BLK in the operation mode information 30 is updated from the normal mode to the high-speed mode by the memory controller 2, for example.

In S2, the semiconductor memory device 1 receives a write command from the memory controller 2.

More specifically, the memory controller 2 issues, based on the operation mode information 30, the write command so as to execute the write operation by applying the high-speed mode to any block BLK among the blocks BLK to which the high-speed mode is applied. In addition, the memory controller 2 issues, based on the operation mode information 30, the write command so as to execute the write operation by applying the normal mode to any block BLK among the blocks BLK to which the normal mode is applied.

In S3, the semiconductor memory device 1 determines whether the block BLK that is the target of the write operation specified by the write command is the block BLK to which the high-speed mode is applied. If the block BLK that is the target of the write operation is the block BLK to which the high-speed mode is applied (S3; YES), the processing proceeds to S5. If the block BLK that is the target of the write operation is the block BLK to which the normal mode is applied (S3; NO), the processing proceeds to S4.

In S4, the semiconductor memory device 1 executes, for the block BLK that is the target of the write operation, the write operation for the block BLK to which the normal mode described with reference to FIG. 12 is applied.

In S5, the semiconductor memory device 1 executes, for the block BLK that is the target of the write operation, the write operation for the block BLK to which the high-speed mode is applied. The write operation for the block BLK to which the high-speed mode is applied will be described later.

In S6, the semiconductor memory device 1 receives a read command from the memory controller 2. The issuance of the read command is executed substantially similarly to the processing in S2.

In S7, the semiconductor memory device 1 determines, based on the read command, whether the specified block BLK that is the target of the read operation is the block BLK to which the high-speed mode is applied. If the block BLK that is the target of the read operation is the block BLK to which the high-speed mode is applied (S7; YES), the processing proceeds to S9. If the block BLK that is the target of the read operation is the block BLK to which the normal mode is applied (S7; NO), the processing proceeds to S8.

In S8, the semiconductor memory device 1 executes, for the block BLK that is the target of the read operation, the read operation for the block BLK to which the normal mode described with reference to FIG. 13 is applied.

In S9, the semiconductor memory device 1 executes, for the block BLK that is the target of the read operation, the read operation for the block to which the high-speed mode is applied. The read operation for the block to which the high-speed mode is applied will be described later.

In 510, the semiconductor memory device 1 receives an erase command from the memory controller 2.

Then, in S11, the semiconductor memory device 1 executes the erase operation for the block BLK that is a target of the erase operation. Accordingly, the data stored in the memory cell transistors MT included in the block BLK is erased all at once. Note that, in the erase operation for the block BLK to which the high-speed mode is applied, in addition to erasing of the data stored in the memory cell transistors MT, the select transistor ST having a threshold voltage greater than the voltage VREAD (included in the "s1" state) can be caused to be in a state of having a threshold voltage less than the voltage VS (the "s0" state).

In addition, if the erase operation is executed for the block BLK to which the high-speed mode is applied, the operation mode corresponding to the block BLK in the operation mode information 30 is updated from the high-speed mode to the normal mode by the memory controller 2, for example. Note that, if the erase operation is executed for the block BLK to which the normal mode is applied, the operation mode information 30 is not updated.

Through the above operation, the overall operation is completed.

Note that, the update of the operation mode information 30 may be executed, for example, after each of a command for the acceleration operation and an erase command is received and before the operation corresponding to the command is executed, or after the operation corresponding to the command is executed.

1.2.4 Acceleration Operation

Next, the acceleration operation executed in S1 will be described.

In the acceleration operation, an operation of raising the threshold voltage of the memory cell transistors MT ("INH") included in the NAND string NS ("INH") is repeatedly executed. Accordingly, the semiconductor memory device 1 raises the threshold voltage of the memory cell transistors MT ("INH") to be equal to or greater than the voltage VREAD. In addition, an operation of raising the threshold voltage of the select transistor ST1 ("INH") included in the NAND string NS ("INH") is repeatedly executed. Accordingly, the semiconductor memory device 1 raises the threshold voltage of the select transistor ST1 ("INH") to be equal to or greater than the voltage VS2. Note that, in the acceleration operation, similarly to the verify operation in the write operation, an operation of determining whether the threshold voltages of the memory cell transistors MT and the select transistor ST1 have reached the voltages VREAD and VS2, respectively, by sensing the threshold voltages may be executed.

Figure 15:
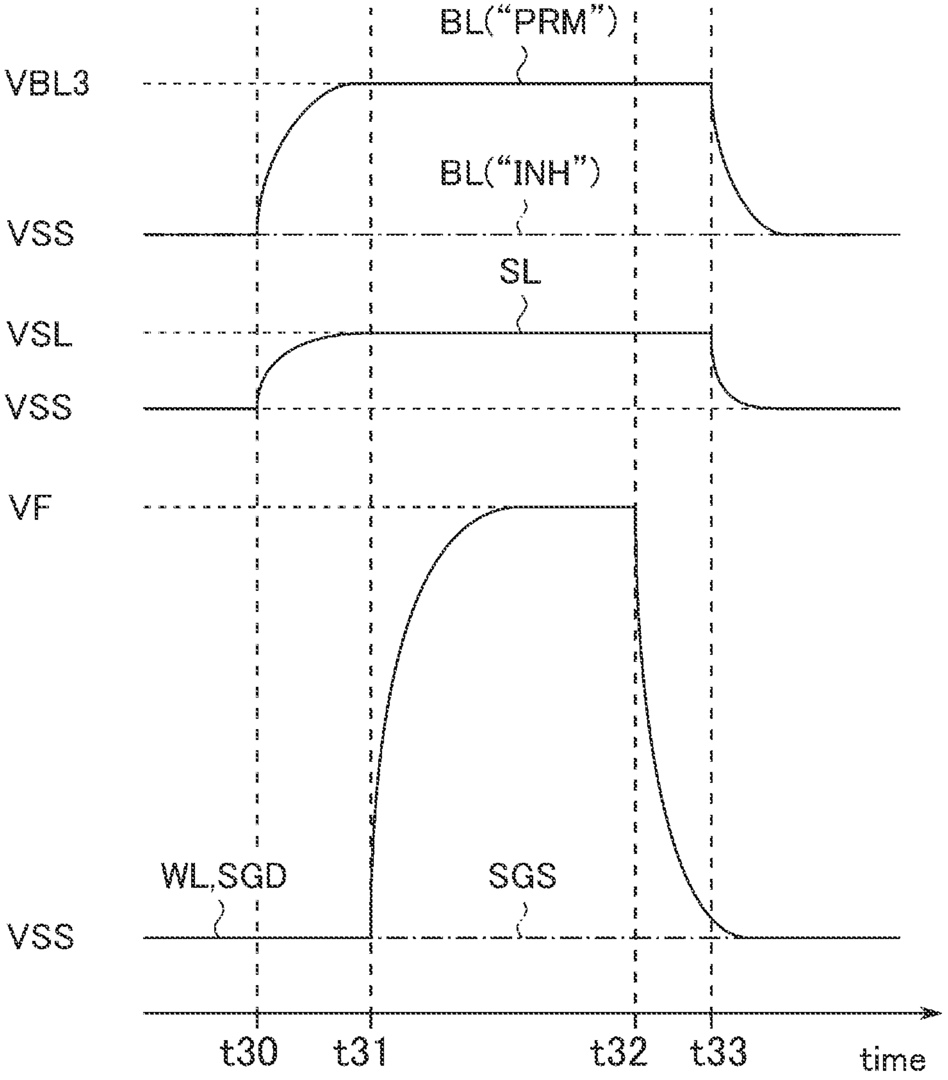
FIG. 15 is a timing chart showing examples of voltages of a bit line, a source line, a select gate line, and a word line during an acceleration operation using the semiconductor memory device according to the embodiment.

In the following description, an example in which the operation of raising the threshold voltage of the memory cell transistors MT ("INH") is executed once in parallel with the operation of raising the threshold voltage of the select transistor ST1 ("INH") once will be described with reference to FIGS. 15 and 16 in terms of the differences from the program operation in FIG. 12. FIG. 15 is a timing chart showing examples of voltages of a bit line, a source line, a select gate line, and a word line during the acceleration operation using the semiconductor memory device according to the embodiment. FIG. 16 is a diagram showing examples of threshold voltages of the memory cell transistors and the select transistors before and after the acceleration operation using the semiconductor memory device according to the embodiment. In FIG. 16, the states of the memory cell transistors MT ("PRM") and MT ("INH") and the select transistors ST1 ("PRM") and ST1 ("INH") before the acceleration operation are shown in the first row. In addition, the states of the memory cell transistors MT ("PRM") and MT ("INH") and the select transistors ST1 ("PRM") and ST1 ("INH") after the acceleration operation are shown in the second row.

In the voltage of the bit line BL shown in the upper part of FIG. 15, the solid line corresponds to the bit line BL ("PRM") coupled to the memory cell transistor MT ("PRM") whose threshold voltage is maintained by executing the operation corresponding to the "1" program operation. The long-dashed short-dashed line corresponds to the bit line BL ("INH") coupled to the memory cell transistor MT ("INH") whose threshold voltage is raised by executing the operation corresponding to the "0" program operation.

At time t30, the sense amplifier module 18 supplies a voltage VBL3 to the bit line BL ("PRM") to perform BL pre-charge. Meanwhile, the voltage VSS is supplied to the bit line BL ("INH"). The voltage VBL3 is a voltage greater than the voltage VBL1, for example.

At time t31, the row decoder module 17 supplies a voltage VF to the select gate lines SGD0 to SGD4 in the selected block BLK. The voltage VF is a voltage that causes the select transistor ST1 ("INH") whose bit line BL has been supplied with the voltage VSS to be in the ON state but causes the select transistor ST1 ("PRM") whose bit line BL has been supplied with the voltage VBL3 to be in the OFF state. Accordingly, in the NAND string NS ("INH"), the potential difference (VF−VSS) between the control gate and the channel increases. As a result, electrons are injected into the charge storage layer, and the threshold voltage of the memory cell transistor MT ("INH") is raised. In addition, the select transistor ST1 ("PRM") is in the OFF state. Accordingly, the threshold voltage of the select transistor ST1 ("PRM") is maintained.

In addition, the row decoder module 17 supplies the voltage VF to all the word lines WL in the selected block BLK. Accordingly, in the NAND string NS ("INH"), the potential difference (VF−VSS) between the control gate and the channel increases. As a result, electrons are injected into the charge storage layer, and the threshold voltage of the memory cell transistor MT ("INH") is raised.

On the other hand, in the NAND string NS ("PRM"), the select transistor ST1 ("PRM") is in the cutoff state. Accordingly, the threshold voltage of the memory cell transistor MT ("PRM") is maintained.

The other processing at time t30, t32, and t33 can be substantially similar to the processing at time t10, t12, and t13, respectively.

This completes the operation of raising the threshold voltage of the memory cell transistor MT ("INH") and the operation of raising the threshold voltage of the select transistor ST1 ("INH").

Note that FIG. 15 is merely an example of a timing chart of the acceleration operation according to the embodiment, and the magnitude relationship of the voltages supplied to the bit line BL, the word line WL, the source line SL, and the select gate line SGD does not necessarily coincide with the magnitude relationship of the voltages shown in FIG. 15. For example, the voltages supplied to the select gate lines SGD0 to SGD4 and the voltages supplied to the word lines WL may be different.

In addition, FIG. 15 shows the example in which the operation of raising the threshold voltage of the memory cell transistor MT ("INH") is executed in parallel with the operation of raising the threshold voltage of the select transistor ST1 ("INH"). However, the operations are not limited thereto. The operation of raising the threshold voltage of the memory cell transistor MT ("INH") and the operation of raising the threshold voltage of the select transistor ST1 ("INH") may be executed at different timings.

As shown in FIG. 16, before the acceleration operation, all the memory cell transistors MT are in the "Er" state, for example. After the acceleration operation, the memory cell transistor MT ("INH") included in the NAND string NS ("INH") is caused to be in the "D" state. In addition, after the acceleration operation and before the write operation, the memory cell transistor MT ("PRM") excluding the memory cell transistor MT ("INH") is maintained in the "Er" state, for example.

In addition, before the acceleration operation, all the select transistors ST1 are in the "s0" state, for example. Before the acceleration operation, the select transistor ST1 ("INH") included in the NAND string NS ("INH") is caused to be in the "s1" state after the acceleration operation. In addition, the select transistor ST1 ("PRM") excluding the select transistor ST1 ("INH") is maintained in the "s0" state.

Note that FIG. 16 shows the case where all the memory cell transistors MT in the block BLK are in the "Er" state before the acceleration operation. However, the operation is not limited thereto. The acceleration operation may be executed for the block BLK in which data is written, for example. In this case, after the acceleration operation, each memory cell transistor MT ("PRM") is maintained in the "Er" state to the "C" state that each memory cell transistor MT ("PRM") has before the acceleration operation, for example.

1.2.5 Write Operation for Block to which High-Speed Mode is Applied

Figure 17:
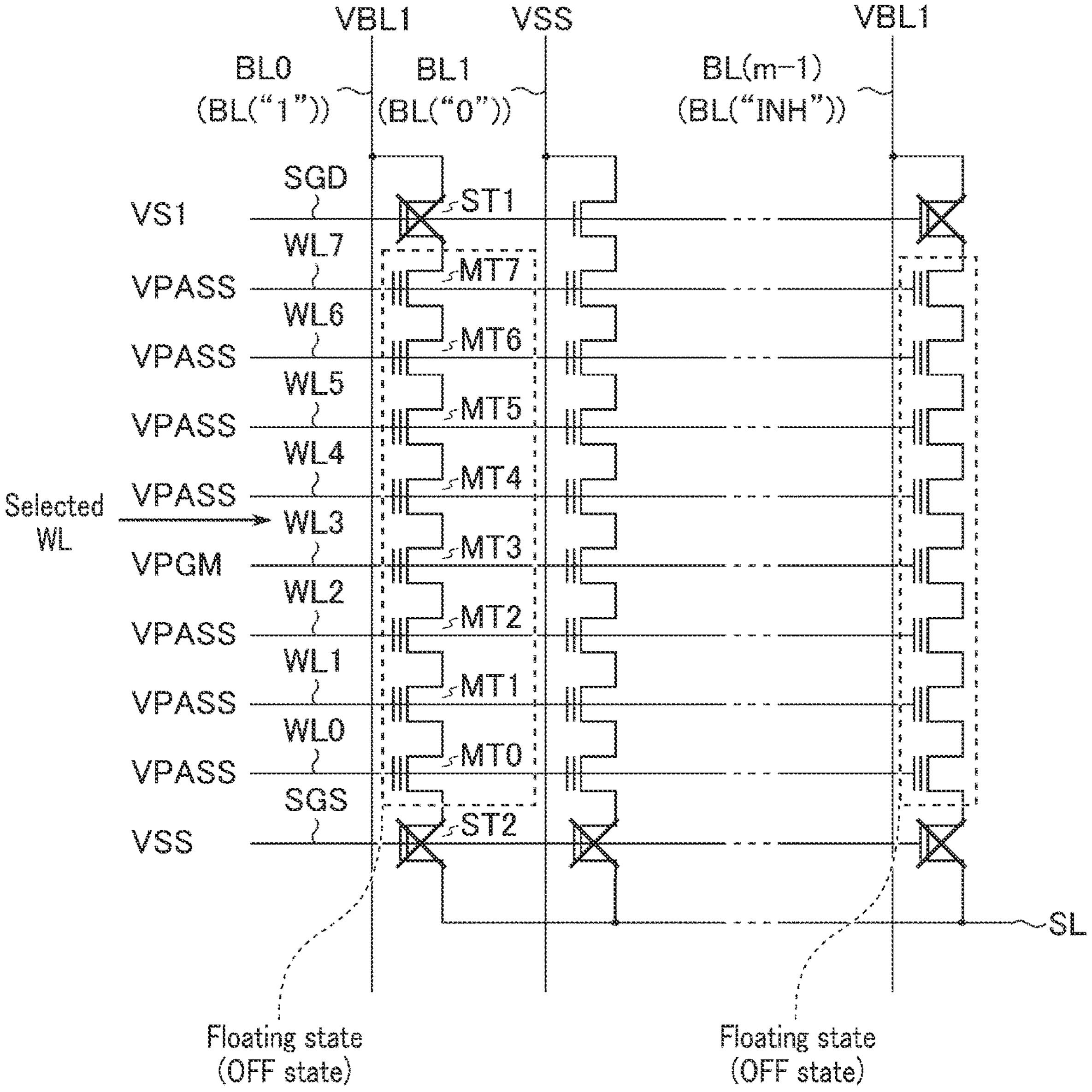
FIG. 17 is a circuit diagram showing examples of voltages of a bit line, a select gate line, and a word line during a program operation in a write operation in which the high-speed mode is applied using the semiconductor memory device according to the embodiment.

Next, the write operation for the block BLK, to which the high-speed mode is applied, executed in S5 will be described with reference to FIG. 17. FIG. 17 is a circuit diagram showing examples of voltages of a bit line, a select gate line, and a word line during the program operation in the write operation in which the high-speed mode is applied using the semiconductor memory device according to the embodiment. The timing chart of the write operation for the block to which the high-speed mode is applied is substantially similar to the timing chart of the write operation shown in FIG. 12 except for the voltage of the bit line BL ("INH"). In the following, the difference between the write operation for the block BLK to which the high-speed mode is applied and the write operation for the block BLK to which the normal mode is applied will be mainly described.

Note that, FIG. 17 shows a bit line BL (m−1) as the bit line BL ("INH") in the string unit SU included in the selected block BLK, for easy understanding of the description. In addition, the bit lines BL0 and BL1 are shown as the bit lines BL ("PRM"). Note that the bit line BL ("INH") is not limited to the bit line BL (m−1), and a plurality of bit lines BL can be bit lines BL ("INH").

In addition, an example in which the word line WL3 is the selected word line WL is shown.

In the write operation for the block BLK to which the high-speed mode is applied, the voltage VBL1 equal to, for example, the bit line BL ("1") is supplied to the bit line BL ("INH") at time t10 in FIG. 12. The voltage of the other bit lines BL ("PRM") is similar to the voltage of the bit line BL in the write operation described with reference to FIG. 12. More specifically, the voltage corresponding to the bit line BL ("0") or BL ("1") is supplied to each of the other bit lines BL ("PRM"). The example in FIG. 17 shows a case where the voltages VBL1 and VSS are supplied to the bit line BL0 corresponding to the bit line BL ("1") and the bit line BL0 corresponding to the bit line BL ("1"), respectively.

With such an operation described above, the select transistor ST1 ("INH") and all the select transistors ST2 are in the OFF state. Accordingly, in addition to the memory cell transistor MT coupled to the bit line BL ("1") and being the target of the "1" program, the memory cell transistor MT ("INH") is also caused to be in the floating state. That is, the memory cell transistor MT ("INH") is caused to be in the OFF state. Accordingly, the NAND string NS ("INH") is caused to be in the inhibited state. In FIG. 17, "x" is attached to the select transistor ST1 ("INH") and all the select transistors ST2 caused to be in the OFF state.

In addition, among the select transistors ST1 ("PRM"), the select transistor ST1 ("PRM") that is the target of the "0" program is caused to be in the ON state. Accordingly, the NAND string NS ("PRM") coupled to the bit line BL ("0") is caused to be in the operable state.

Note that, as described later, in the write operation for the block BLK to which the high-speed mode is applied, the period required to raise the voltage of the selected word line WL from the voltage VSS to the voltage VPGM is shorter than the period T1 in the write operation for the block BLK to which the normal mode is applied.

In addition, as described above, no data is written into the memory cell transistor MT ("INH") in S5. Accordingly, the length of the data written in S5 is shorter than the length of the data written in S4.

1.2.6 Read Operation for Block to which High-Speed Mode is Applied

Figure 18:
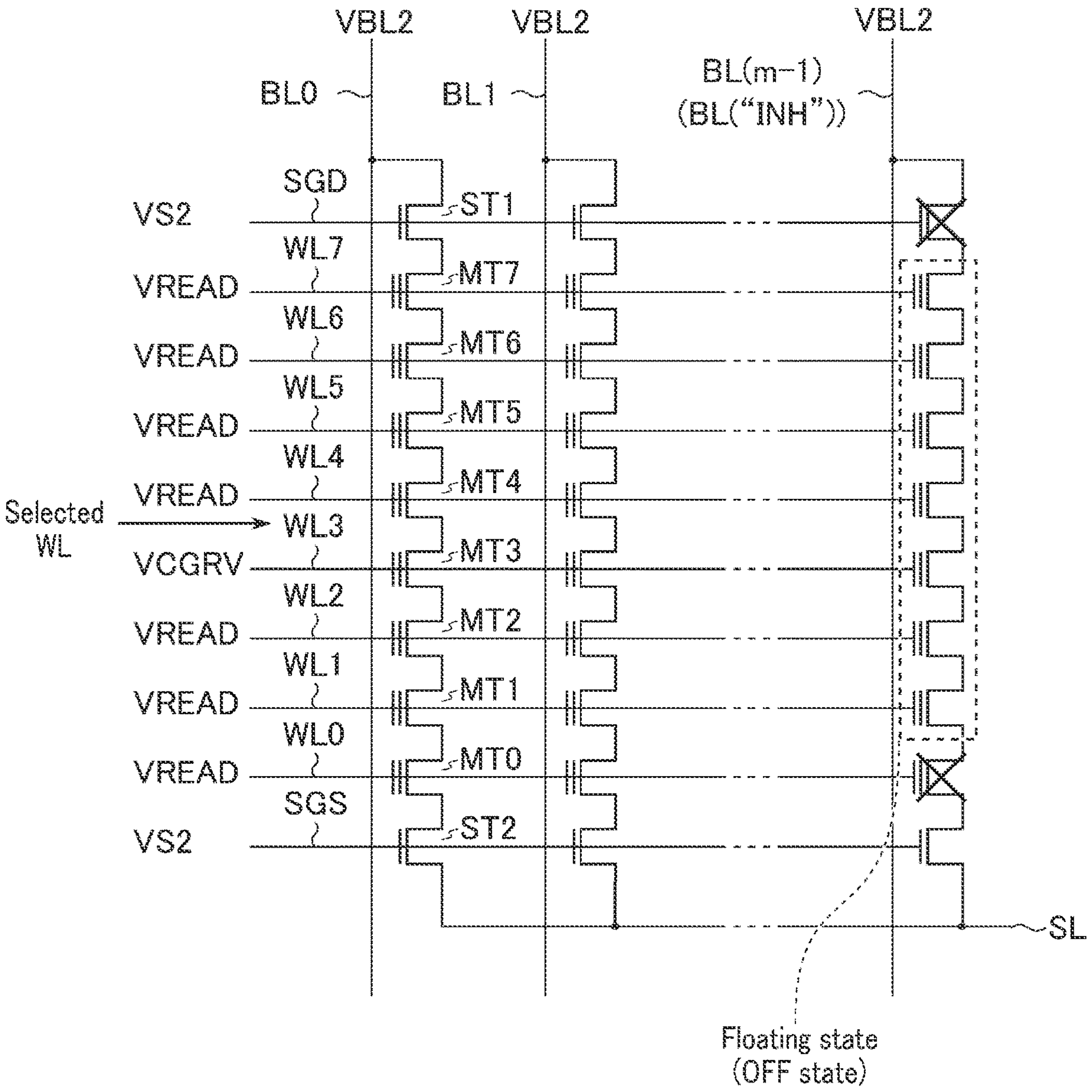
FIG. 18 is a circuit diagram showing examples of voltages of a bit line, a select gate line, and a word line during a read operation in which the high-speed mode is applied using the semiconductor memory device according to the embodiment.

Next, the read operation for the block BLK, to which the high-speed mode is applied, executed in S9 will be described with reference to FIG. 18. FIG. 18 is a circuit diagram showing examples of voltages of a bit line, a select gate line, and a word line during the read operation in which the high-speed mode is applied using the semiconductor memory device according to the embodiment. The timing chart of the read operation for the block to which the high-speed mode is applied is substantially similar to the timing chart of the read operation shown in FIG. 13. In the following, the difference between the read operation for the block BLK to which the high-speed mode is applied and the read operation for the block BLK to which the normal mode is applied will be mainly described.

Note that, similarly to the description of FIG. 17, FIG. 18 shows the bit line BL (m−1) as the bit line BL ("INH") in the string unit SU included in the selected block BLK, for easy understanding of the description. In addition, the bit lines BL0 and BL1 are shown as the bit lines BL ("PRM"). Note that the bit line BL ("INH") is not limited to the bit line BL (m−1), and a plurality of bit lines BL can be bit lines BL ("INH").

In addition, an example in which the word line WL3 is the selected word line WL is shown.

In the read operation for the block BLK to which the high-speed mode is applied, all the memory cell transistors MT ("INH") are in the "D" state. Note that all the select transistors ST1 ("INH") are in the "s1" state. From the above, in the read operation for the block BLK to which the high-speed mode is applied, the memory cell transistors MT ("INH") and the select transistors ST1 ("INH") are always caused to be in the OFF state. Note that the memory cell transistors MT1 ("INH") to MT7 ("INH") are caused to be in the floating state between the memory cell transistor MT0 ("INH") and the select transistor ST1 ("INH") of the NAND string NS ("INH"). Accordingly, the NAND string NS ("INH") is caused to be in the inhibited state. In FIG. 18, "x" is attached to the memory cell transistor MT0 ("INH") and the select transistor ST1 ("INH") caused to be in the OFF state.

In addition, all the select transistors ST1 ("PRM") are caused to be in the ON state. Accordingly, the NAND string NS ("PRM") coupled to the bit line BL ("0") is caused to be in the operable state.

Note that, as described later, in the read operation for the block BLK to which the high-speed mode is applied, the period required to raise the voltage of the selected word line WL from the voltage VSS to the voltage VREAD is shorter than the period T2 in the read operation for the block BLK to which the normal mode is applied.

In addition, since no data is written into the memory cell transistor MT ("INH") as described above, the length of the data read in S9 is shorter than the length of the data read in S8.

1.3 Effects

According to the embodiment, it is possible to improve the operation speed of the semiconductor memory device 1. Effects of the embodiment are described below.

The semiconductor memory device 1 according to the embodiment is configured to cause the memory cell transistor MT ("INH") included in the NAND string NS ("INH") caused to be in the inhibited state to be in the OFF state when reading data from the memory cell transistor MT ("PRM") that is the target of reading in the read operation for the block BLK to which the high-speed mode is applied. With such a configuration, it is possible for the semiconductor memory device 1 according to the embodiment to facilitate boosting of the word lines WL in the read operation. Accordingly, it is possible to improve the speed of the read operation for the block BLK to which the high-speed mode is applied. Therefore, it is possible to improve the operation speed of the semiconductor memory device 1.

To supplement, when the word lines WL are boosted, the boost speed can be reduced due to the parasitic capacitance caused by the charge storage layers of the memory cell transistors MT. Accordingly, the reduced speed of the read operation can be a problem. According to the embodiment, during the read operation for the block BLK to which the high-speed mode is applied, all the memory cell transistors MT ("INH") included in the NAND string NS ("INH") caused to be in the inhibited state are caused to be in the OFF state. Accordingly, when each word line WL is boosted, it is possible to control the influence of the parasitic capacitance of the memory cell transistor MT ("INH") corresponding to the word line WL. For this reason, it is possible to facilitate boosting of each word line WL in the read operation for the block BLK to which the high-speed mode is applied. Therefore, it is possible to improve the speed of the read operation for the block BLK to which the high-speed mode is applied.

In addition, according to the embodiment, during the write operation for the block BLK to which the high-speed mode is applied, between the select transistors ST1 ("INH") and ST2 ("INH") in the NAND string NS ("INH"), all the memory cell transistors MT ("INH") are caused to be in the OFF state. Accordingly, even in the write operation for the block BLK to which the high-speed mode is applied, it is possible to facilitate boosting of each word line WL for the same reason as the read operation for the block BLK to which the high-speed mode is applied. Therefore, it is also possible to improve the speed of the write operation for the block BLK to which the high-speed mode is applied.

In addition, in the embodiment, in the write operation and read operation in which the high-speed mode is applied, writing and reading of data are not executed for the NAND string NS ("INH"). Accordingly, the length of data to be written in the write operation for the block BLK to which the high-speed mode is applied is shorter than the length of data to be written in the write operation for the block BLK to which the normal mode is applied. In addition, the length of data to be read in the read operation for the block BLK to which the high-speed mode is applied is shorter than the length of data to be read in the read operation for the block BLK to which the normal mode is applied. With such a configuration described above, it is also possible to improve the speed of the write operation and the speed of the read operation.

In addition, according to the embodiment, the NAND string NS ("INH") caused to be in the inhibited state during the read operation for the block BLK to which the high-speed mode is applied is included in the Far side region in the block BLK. With such a configuration, it is possible to effectively improve the speed of the write operation and the speed of the read operation for the block BLK to which the high-speed mode is applied, as compared with a case where the NAND string NS ("INH") is included in the Near side region of each block BLK.

To supplement, in a word line WL extending in the X direction, the boosting of the portion of the word line WL included in the Far side region can be delayed from the boosting of the portion of the word line WL included in the Near side region due to the magnitude relationship of the wiring length. Therefore, by not using the NAND string NS included in the Far side region during the write operation and read operation in which the high-speed mode is applied, it is possible to effectively facilitate the boost of the word lines WL.

In addition, the block BLK to which the high-speed mode is applied is selected from, for example, the blocks BLK in which the wiring length between each block BLK and the driver module 16 is equal to or less than a predetermined length. According to such a configuration, since the wiring length between the block BLK to which the high-speed mode is applied and the driver module 16 can be set within the range of the predetermined length, it is possible to effectively improve the speed of the write operation and read operation for the block BLK to which the high-speed mode is applied, as compared with a case where the wiring length is greater than the predetermined length.

2 Modifications

The above embodiment can be variously modified. Hereinafter, a semiconductor memory device according to modifications of the embodiment will be described.

2.1 First Modification

The above embodiment describes the example in which all the memory cell transistors MT ("INH") coupled to the bit line BL ("INH") are caused to be in the "D" state in the acceleration operation, but is not limited thereto. For example, only the memory cell transistor MT0 ("INH") among all the memory cell transistors MT ("INH") coupled to the bit line BL ("INH") may be caused to be in the "D" state.

In the following description, a configuration and operation of the semiconductor memory device 1 according to a first modification will be described mainly in terms of the differences from the configuration and operation of the semiconductor memory device 1 according to the first modification.

Figure 19:
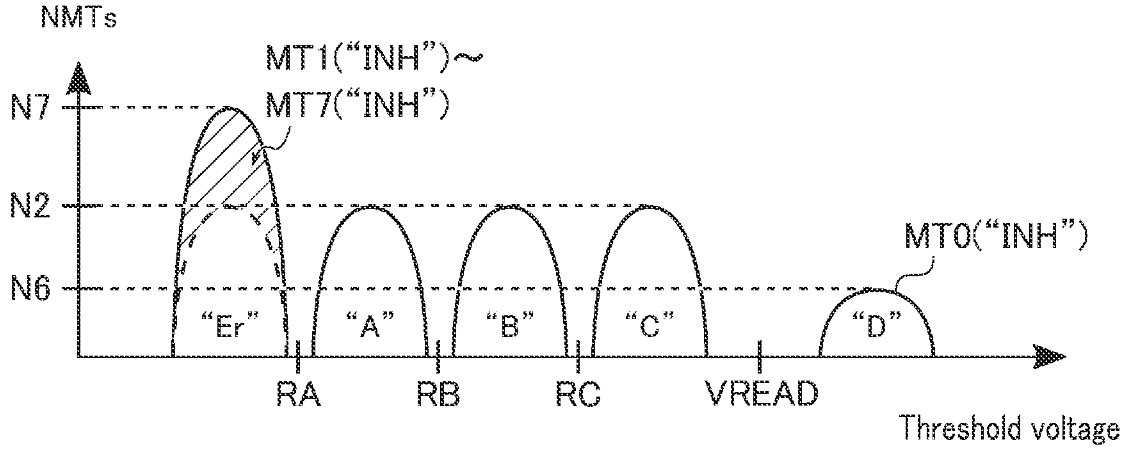
FIG. 19 is a schematic diagram showing an example of a threshold voltage distribution of memory cell transistors in a block, to which the high-speed mode is applied, included in the memory cell array of the semiconductor memory device according to a first modification.

The threshold voltage distribution of the memory cell transistors MT in a case where the write operation is executed for the block BLK to which the high-speed mode is applied in the first modification will be described with reference to FIG. 19. FIG. 19 is a schematic diagram showing an example of a threshold voltage distribution of the memory cell transistors in the block, to which the high-speed mode is applied, included in the memory cell array of the semiconductor memory device according to the first modification. In the threshold voltage distribution shown in FIG. 19, the horizontal axis corresponds to the threshold voltage of the memory cell transistors MT. The vertical axis corresponds to the number of memory cell transistors MT. In FIG. 19, the number of memory cell transistors MT is indicated as a value NMTs.

When the write operation and the read operation are executed for the block BLK to which the high-speed mode is applied, the memory cell transistor MT0 ("INH") is included in the "D" state. In addition, the memory cell transistors MT1 ("INH") to MT7 ("INH") are included in the "Er" state, for example. With such a configuration described above, the height of the "A" state to the "C" state is substantially equal to the value N2, for example. The height of the "D" state is substantially equal to the value N6, for example. In addition, the "Er" state is equivalent to, for example, a distribution in which the memory cell transistors MT1 ("INH") to MT7 ("INH") included in the hatched portion in FIG. 19 are added to the "Er" state in the embodiment in FIG. 10 indicated by the dotted line. Accordingly, the height of the "Er" state is a value N7 greater than the value N2, for example.

Figure 20:
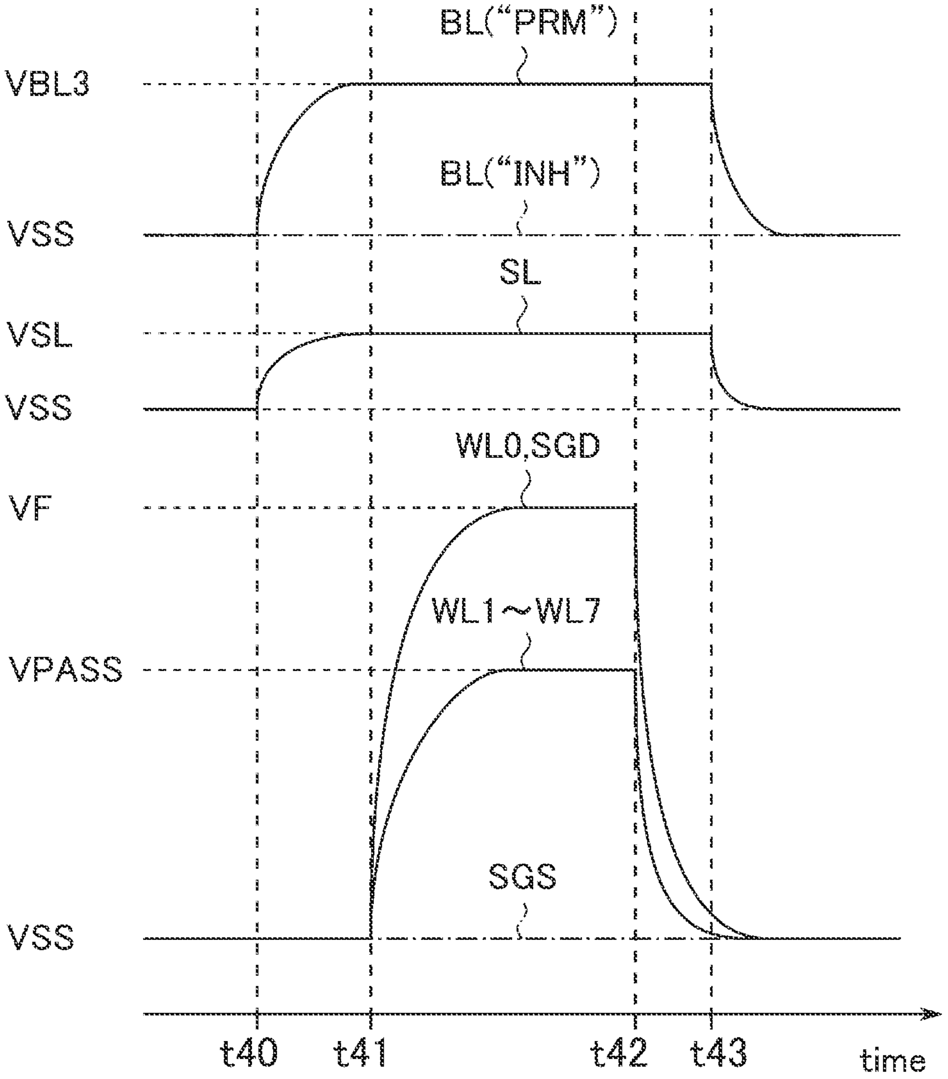
FIG. 20 is a timing chart showing examples of voltages of a bit line, a source line, a select gate line, and a word line during the acceleration operation using the semiconductor memory device according to the first modification.

Next, an operation according to the first modification will be described with reference to FIG. 20. FIG. 20 is a timing chart showing examples of voltages of a bit line, a source line, a select gate line, and a word line during the acceleration operation using the semiconductor memory device according to the first modification. In the following, the acceleration operation according to the first modification will be described mainly in terms of the differences from the acceleration operation according to the embodiment.

At time t41, the semiconductor memory device 1 supplies the voltage VF to the word line WL0. Accordingly, the threshold voltage of the memory cell transistor MT0 ("INH") is raised. Meanwhile, the semiconductor memory device 1 supplies the voltage VPASS to the other word lines WL1 to WL7. Accordingly, the threshold voltage of the memory cell transistors MT1 ("INH") to MT7 ("INH") is maintained.

The other operations from time t40 to time t43 can be substantially similar to the operations from time t30 to time t33 in the embodiment.

In addition, the write operation and the read operation can be substantially similar to the write operation and the read operation according to the embodiment. To supplement, the write operation in which the high-speed mode is applied is substantially similar to the write operation according to the embodiment. In addition, in the read operation in which the high-speed mode is applied, the memory cell transistors MT1 ("INH") to MT7 ("INH") are caused to be in the floating state by the select transistor ST1 ("INH") and the memory cell transistor MT0 ("INH") caused to be in the OFF state. As described above, in the write operation and read operation in which the high-speed mode is applied, the NAND string NS ("INH") is caused to be in the inhibited state.

With the first modification, effects similar to those of the embodiment are also obtained.

2.2 Second Modification

The above embodiment and first modification describe the case where the NAND string NS ("INH") is caused to be in the inhibited state by the select transistor ST1 ("INH") and the memory cell transistor MT ("INH") in the read operation in which the high-speed mode is applied. However, the operations are not limited thereto. In the read operation in which the high-speed mode is applied, the NAND string NS ("INH") may be caused to be in the inhibited state by the select transistor ST1 ("INH") and the select transistor ST2 ("INH").

Figure 21:
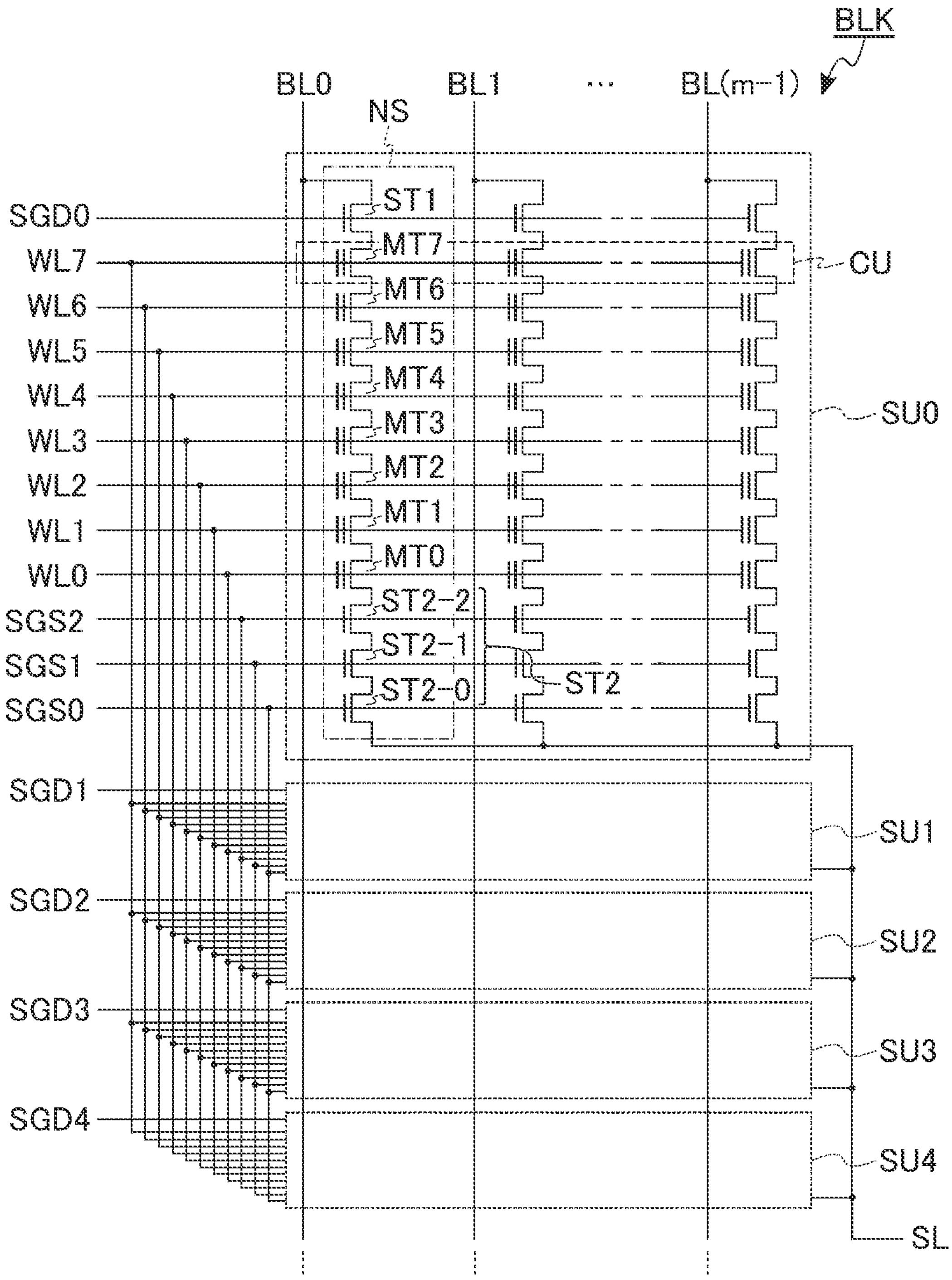
FIG. 21 is a circuit diagram for explaining an example of a configuration of the memory cell array of the semiconductor memory device according to a second modification.

A configuration of the semiconductor memory device 1 according to a second modification will be described with reference to FIG. 21. FIG. 21 is a circuit diagram for describing an example of a configuration of the memory cell array of the semiconductor memory device according to the second modification.

In each NAND string NS, the select transistor ST2 is constituted by three select transistors ST2-0, ST2-1, and ST2-2. Note that, the following describes an example in which the select transistor ST2 is constituted by the three transistors, but is not limited thereto. The select transistor ST2 may be constituted by one transistor as in the embodiment, or may be constituted by two, or four or more transistors.

A first end of the select transistor ST2-2 is coupled to the other ends of the memory cell transistors MT0 to MT7 coupled in series. A second end of the select transistor ST2-2 is coupled to a first end of the select transistor ST2-1. A second end of the select transistor ST2-1 is coupled to a first end of the select transistor ST2-0. A second end of the select transistor ST2-0 is coupled to the source line SL.

Although not shown, a cross-sectional structure of the memory cell array 10 of the semiconductor memory device 1 according to the second modification is similar to the cross-sectional structure of the memory cell array of the semiconductor memory device according to the embodiment, except that the number of conductor layers 62 is different. That is, the memory cell array 10 according to the second modification includes, for example, three conductor layers 62 instead of one conductor layer 62.

The threshold voltage distribution of the memory cell transistors MT when the read operation is executed for the block BLK to which the high-speed mode is applied in the second modification will be described with reference to FIG.

Figure 22:
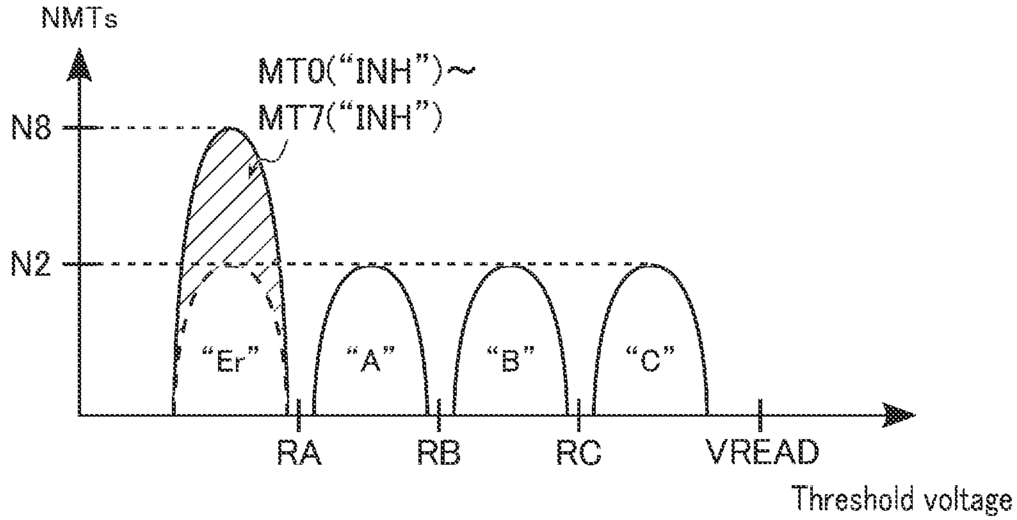
FIG. 22 is a schematic diagram showing an example of a threshold voltage distribution of memory cell transistors in a block, to which the high-speed mode is applied, included in the memory cell array of the semiconductor memory device according to the second modification.

22. FIG. 22 is a schematic diagram showing an example of a threshold voltage distribution of the memory cell transistors in the block, to which the high-speed mode is applied, included in the memory cell array of the semiconductor memory device according to the second modification. In the threshold voltage distribution shown in FIG. 22, the horizontal axis corresponds to the threshold voltage of the memory cell transistors MT. The vertical axis corresponds to the number of memory cell transistors MT. In FIG. 22, the number of memory cell transistors MT is indicated as a value NMTs.

When the read operation is executed for the block BLK to which the high-speed mode is applied, the memory cell transistors MT0 ("INH") to MT7 ("INH") are included in the "Er" state, for example. Accordingly, the height of the "Er" state is a value N8 greater than the value N7, for example. The height of the "A" state to the "C" state is substantially equal to the value N2, for example. Note that, at a position equal to the "Er" state, the distribution indicated by the dotted line is equivalent to the "Er" state shown in the embodiment in FIG. 10. In addition, in the "Er" state shown in FIG. 22, the memory cell transistors MT included in the hatched region are equivalent to the memory cell transistors MT0 ("INH") to MT7 ("INH").

Note that, in the second modification, during the read operation in which the high-speed mode is applied, each of the memory cell transistors MT0 ("INH") to MT7 ("INH") may have the "D" state. In this case, the threshold voltage distribution of the memory cell transistors MT during the read operation in which the high-speed mode is applied is similar to the threshold voltage distribution shown in FIG. 10.

Figure 23:
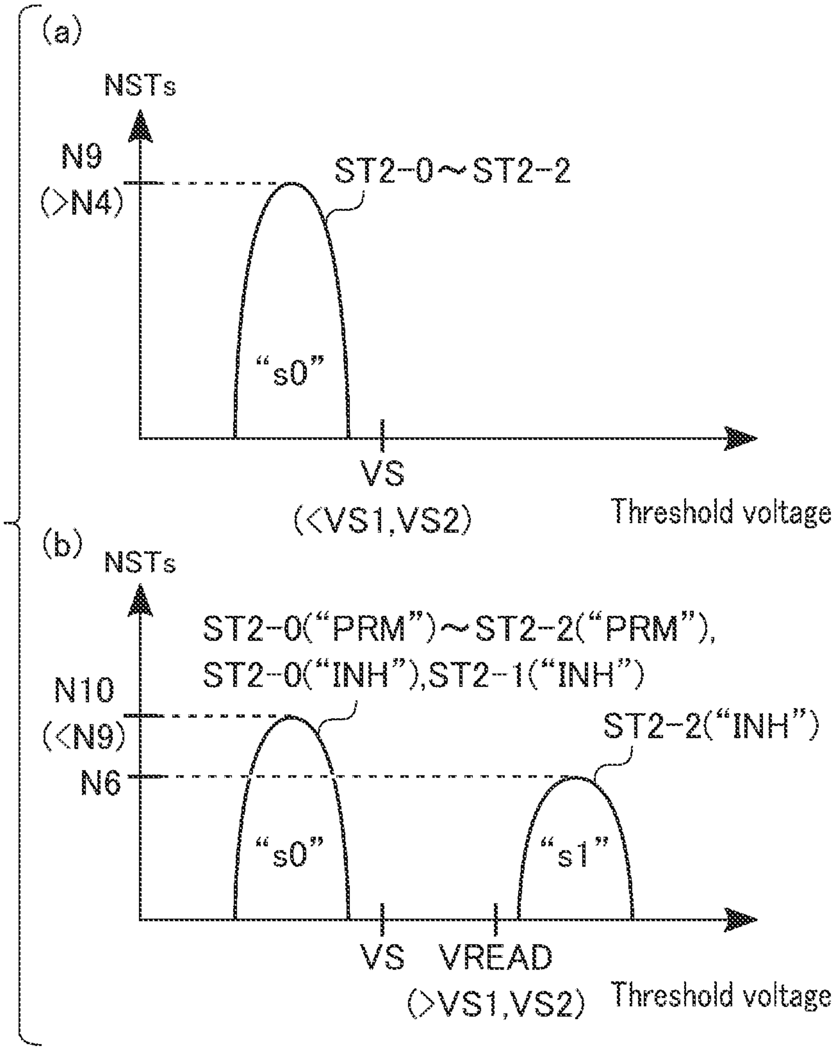
FIG. 23 is a schematic diagram showing examples of threshold voltage distributions of select transistors included in the memory cell array of the semiconductor memory device according to the second modification.

Next, threshold voltage distributions of the select transistors ST2-0 to ST2-2 in the second modification will be described with reference to FIG. 23. FIG. 23 is a schematic diagram showing examples of threshold voltage distributions of the select transistors included in the memory cell array of the semiconductor memory device according to the second modification. FIG. 23 (*a*) shows an example of the threshold voltage distribution of the select transistors ST2-0 to ST2-2 when the read operation is executed for the block BLK to which the normal mode is applied. In addition, FIG. 23 (*b*) shows an example of the threshold voltage distribution of the select transistors ST2-0 to ST2-2 when the read operation is executed for the block BLK to which the high-speed mode is applied. In the threshold voltage distributions shown in FIG. 23, the horizontal axis corresponds to the threshold voltages of the select transistors ST2-0 to ST2-2. The vertical axis corresponds to the number of select transistors ST2-0 to ST2-2. In FIG. 23, the number of the select transistors ST2-0 to ST2-2 is indicated as a value NSTs.

As shown in FIG. 23 (*a*), in the threshold voltage distribution when the read operation is executed for the block BLK to which the normal mode is applied, only the "s0" state is formed. In the block BLK to which the normal mode is applied, the height of the "s0" state is a value N9 greater than the value N4, for example.

As shown in FIG. 23 (*b*), in the threshold voltage distribution when the read operation is executed for the block BLK to which the high-speed mode is applied, an "s1" state is formed in addition to the "s0" state. In FIG. 23 (*b*), the select transistors included in the "s0" state are the select transistors ST2-0 ("PRM") to ST2-2 ("PRM") coupled to the bit line BL ("PRM"), and ST2-0 ("INH") and ST2-1 ("INH") coupled to the bit line BL ("INH"). The select transistor included in the "s1" state is ST2-2 ("INH") coupled to the bit line BL ("INH"). In FIG. 23 (*b*), the height of the "s0" state is a value N10 less than the value N9, for example. The height of the "s1" state is equal to the value N6, for example.

Note that, the above describes the case where the select transistors ST2-0 to ST2-2 have the "s0" state and the "s1" state similarly to the select transistor ST1, but is not limited thereto. The select transistors ST2-0 to ST2-2 may have an "s2" state and an "s3" state different from the "s0" state and the "s1" state. Note that the threshold voltage in the "s2" state is less than the voltage VS. In addition, the threshold voltage in the "s3" state is equal to or greater than the voltage VREAD.

In addition, the above describes the case where the select transistor ST2-2 ("INH") has the "s1" state and the select transistors ST2-0 ("INH") and ST2-1 ("INH") have the "s0" state, but is not limited thereto. At least one of the select transistors ST2-0 ("INH") to ST2-2 ("INH") is only required to be caused to be in the "s1" state.

Figure 24:
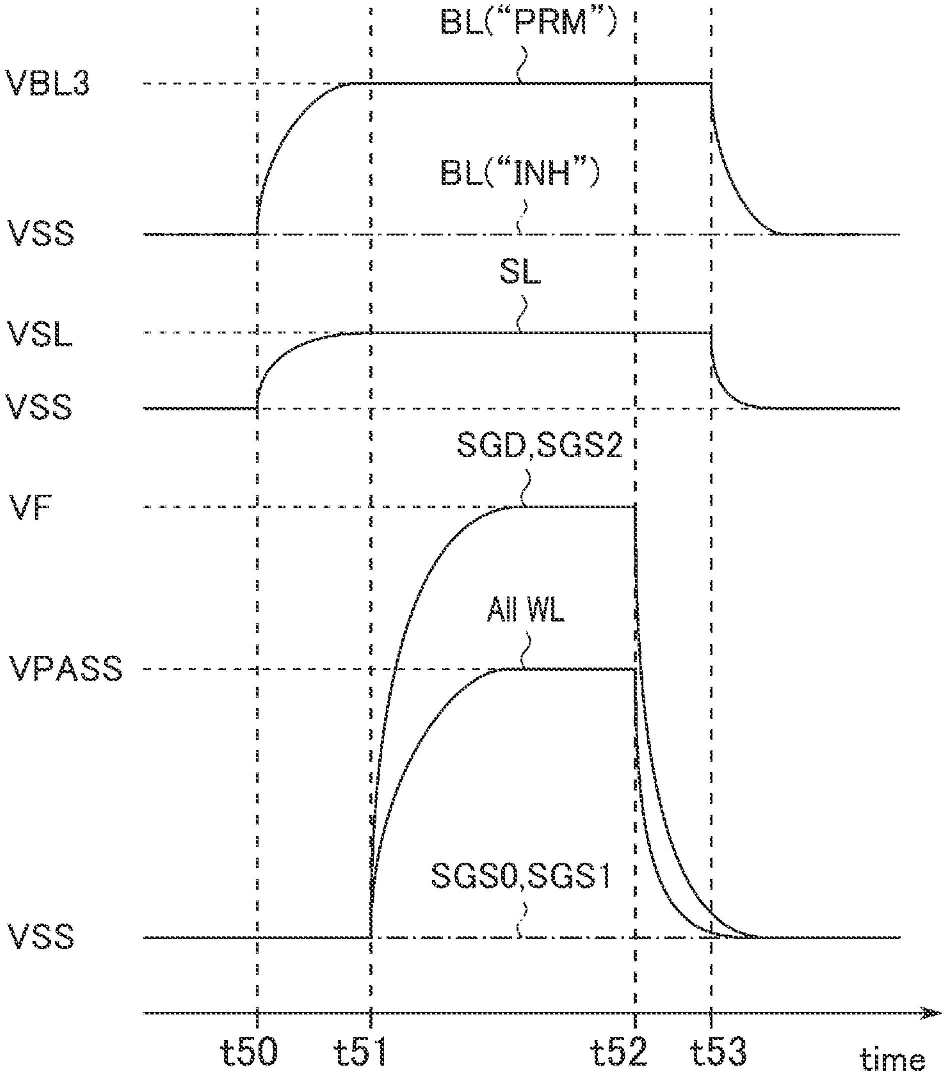
FIG. 24 is a timing chart showing examples of voltages of a bit line, a source line, a select gate line, and a word line during the acceleration operation using the semiconductor memory device according to the second modification.

Next, an operation according to the second modification will be described with reference to FIG. 24. FIG. 24 is a timing chart showing examples of voltages of a bit line, a source line, a select gate line, and a word line during the acceleration operation using the semiconductor memory device according to the second modification.

In the acceleration operation according to the second modification, the operation of raising the threshold voltage of the select transistor ST1 ("INH") is executed together with the operation of raising the threshold voltage of the select transistor ST2-2 ("INH"). In addition, in the acceleration operation according to the second modification, the operation of raising the threshold voltages of the memory cell transistor MT ("INH"), the select transistor ST2-0 ("INH"), and the select transistor ST2-1 ("INH") is not executed.

At time t51, the semiconductor memory device 1 supplies the voltage VPASS to all the word lines WL. Accordingly, the threshold voltages of all the memory cell transistors MT are maintained.

In addition, the semiconductor memory device 1 supplies the voltage VF equal to the select gate line SGD to the select gate line SGS2, for example. Accordingly, in the NAND string NS coupled to the bit line BL ("INH"), the select transistor ST2-2 is in the ON state. Accordingly, the threshold voltage of the select transistor ST2-2 is raised.

Meanwhile, the semiconductor memory device 1 supplies the voltage VSS to the select gate lines SGS0 and SGS1, for example. Accordingly, the threshold voltages of the select transistors ST2-0 and ST2-1 are maintained.

The other operations from time t50 to time t53 can be substantially similar to the operations from time t30 to time t33 and to the operations from time t40 to time t43.

Figure 25:
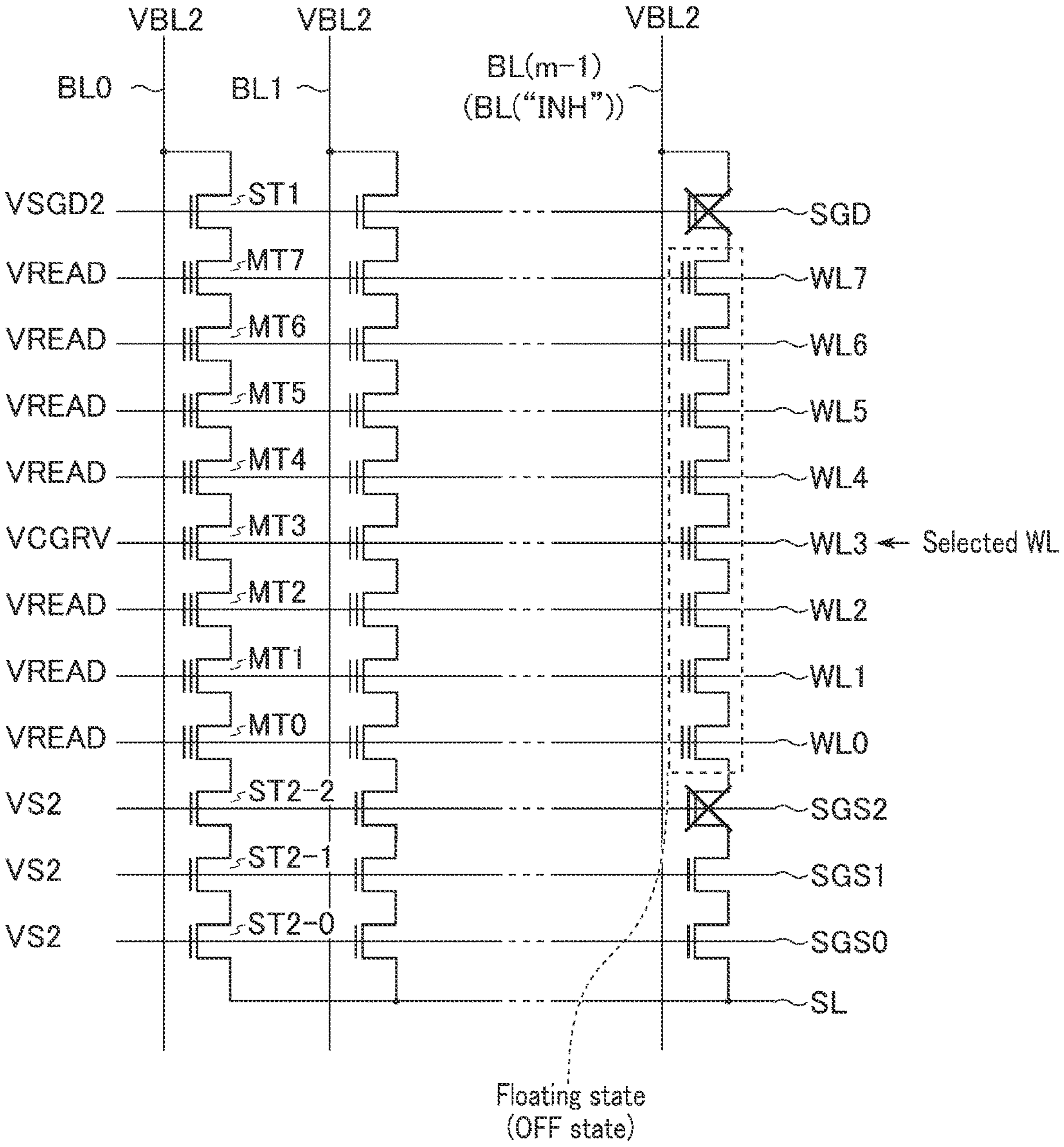
FIG. 25 is a circuit diagram showing examples of voltages of a bit line, a select gate line, and a word line during a read operation in which the high-speed mode is applied using the semiconductor memory device according to the second modification.

In addition, the read operation when the high-speed mode is applied will be described with reference to FIG. 25. FIG. 25 is a circuit diagram showing examples of voltages of a bit line, a select gate line, and a word line during the read operation in which the high-speed mode is applied using the semiconductor memory device according to the second modification. In the following, the difference between the read operation when the high-speed mode is applied and the read operation when the high-speed mode is applied in the embodiment will be mainly described.

Note that, similarly to the description of FIGS. 17 and 18, FIG. 25 shows the bit line BL (m−1) as the bit line BL ("INH") in the string unit SU included in the selected block BLK, for easy understanding of the description. In addition, the bit lines BL0 and BL1 are shown as the bit lines BL ("PRM"). Note that the bit line BL ("INH") is not limited to the bit line BL (m−1), and a plurality of bit lines BL can be bit lines BL ("INH").

In addition, an example in which the word line WL3 is the selected word line WL is shown.

In the read operation when the high-speed mode is applied, the voltage VS2 is supplied to each of the select gate lines SGS0, SGS1, and SGS2. Accordingly, the select transistor ST2-2 ("INH") is caused to be in the OFF state. For this reason, in the NAND string NS ("INH"), all the memory cell transistors MT ("INH") provided between the select transistors ST1 ("INH") and ST2-2 ("INH") caused to be in the OFF state are caused to be in the floating state. That is, all the memory cell transistors MT ("INH") are caused to be in the OFF state. Accordingly, the NAND string NS ("INH") is caused to be in the inhibited state.

Note that, the above example describes the case where the select transistor ST2-2 ("INH") closest to the memory cell transistor MT among the transistors constituting the select transistor ST2 ("INH") is caused to be in the "s1" state, but is not limited thereto. If the select transistor ST2 is constituted by a plurality of transistors, at least one transistor among the transistors may be caused to be in the "s1" state in the acceleration operation.

In addition, if the select transistor ST2 is constituted by one transistor as in the embodiment, the select transistors ST2 ("INH") and ST2 ("PRM") are caused to be in the "s1" state and the "s0" state, respectively, in the acceleration operation. The operation of raising the threshold voltage of the select transistor ST2 ("INH") can be similar to the operation of raising the threshold voltage of the memory cell transistor MT ("INH") and the threshold voltage of the select transistor ST1 ("INH").

With the second modification, effects similar to those of the embodiment and the first modification are also achieved.

2.3 Third Modification

In addition, the above embodiment describes the case where the acceleration operation is executed before the write operation in the overall operation in which the high-speed mode is applied, but is not limited thereto. In the overall operation in which the high-speed mode is applied, the acceleration operation may be executed after the write operation. A configuration of the semiconductor memory device 1 according to a third modification can be similar to the configuration of the semiconductor memory device according to the embodiment. For this reason, in the following description, the difference between the operation of the semiconductor memory device 1 according to the third modification and the operation of the semiconductor memory device according to the embodiment will be mainly described.

In the third modification, the semiconductor memory device 1 is configured to execute the write operation for the block BLK that is the target of the high-speed mode, and then execute the acceleration operation for the block BLK. Then, by the acceleration operation after the write operation is executed, at least one NAND string NS included in the block BLK is caused to be in the inhibited state when the read operation is executed for the block BLK.

Figure 26:
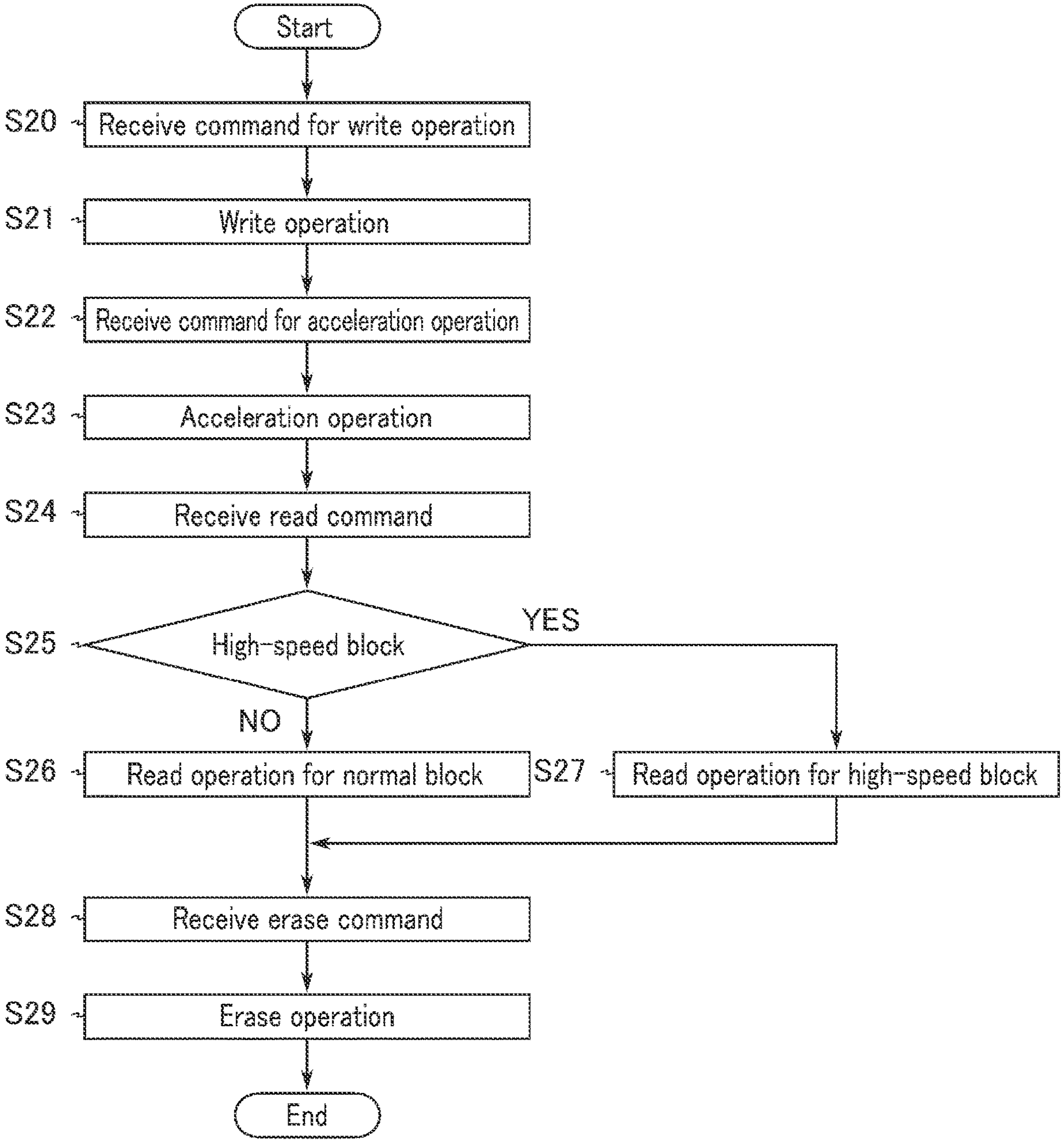
FIG. 26 is a flowchart showing an example of an overall operation when the high-speed mode is applied using the semiconductor memory device according to a third modification.

An example of the overall operation when the high-speed mode is applied in the semiconductor memory device 1 according to the third modification will be described with reference to FIG. 26. FIG. 26 is a flowchart showing an example of the overall operation when the high-speed mode is applied using the semiconductor memory device according to the third modification. FIG. 26 shows an example of the overall operation when the acceleration operation is executed for the block BLK to which the write operation has been executed, and the read operation and the erase operation are executed for the block BLK or the other blocks BLK.

In S20, the semiconductor memory device 1 receives a write command for the block BLK to which the high-speed mode is applied.

Note that the block BLK that is the target of the acceleration operation and the NAND string NS ("INH") are selected in advance before S20 by the memory controller 2, for example.

In S21, the write operation is executed for the block BLK to which the high-speed mode is applied, similarly to the write operation for the normal block BLK. Note that, in the write operation in S21, writing of data is executed only for the NAND string NS ("PRM") caused to be in the operable state in the read operation in which the high-speed mode is applied, for example. In the read operation in which the high-speed mode is applied, writing of data into the NAND string NS ("INH") caused to be in the inhibited state is not executed, for example.

The operations in S22 to S29 are substantially similar to the operations in S0 and S1, and S6 to S11, respectively.

Through the above operation, the overall operation according to the third modification is completed.

Note that the update of the operation mode information 30 for the block BLK to which the high-speed mode is applied is performed after the acceleration operation is executed similarly to the embodiment, for example.

Figure 27:
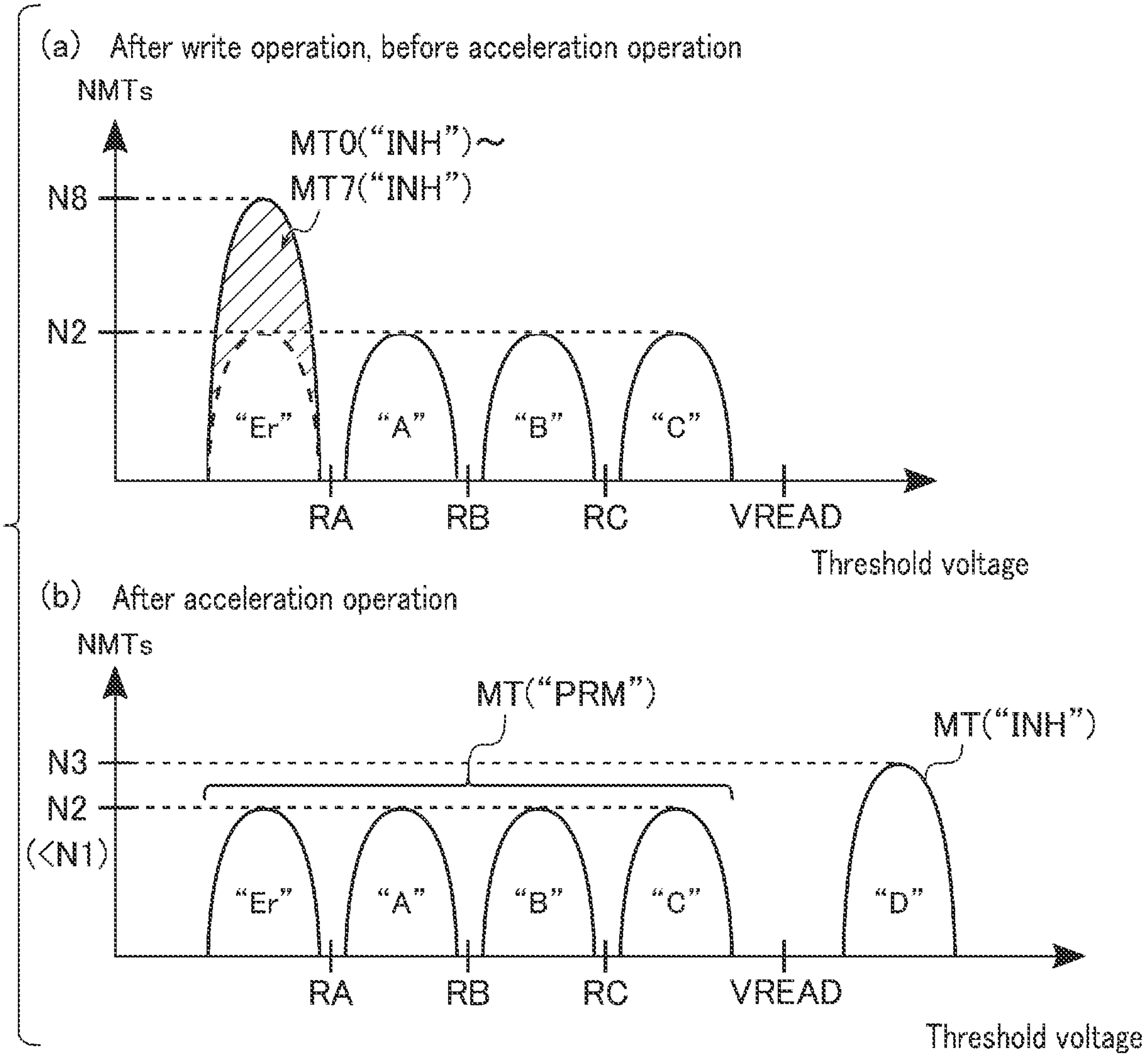
FIG. 27 is a schematic diagram showing examples of threshold voltage distributions of memory cell transistors included in the memory cell array of the semiconductor memory device according to the third modification.

With such an operation described above, the threshold voltage distribution of the memory cell transistors MT included in the block BLK to which the high-speed mode is applied changes as shown in FIG. 27, for example. FIG. 27 is a schematic diagram showing examples of threshold voltage distributions of the memory cell transistors included in the memory cell array of the semiconductor memory device according to the third modification. FIG. 27 (*a*) shows an example of the threshold voltage distribution of the memory cell transistors MT after the write operation is executed for the block BLK to which the high-speed mode is applied and before the acceleration operation is executed. In addition, FIG. 27 (*b*) shows an example of the threshold voltage distribution of the memory cell transistors MT of the block BLK to which the high-speed mode is applied after the acceleration operation is executed. In the following, an example in which the high-speed mode is applied to the block BLK in which all the memory cell transistors MT have the "Er" state before the write operation will be described.

In the third modification, data is written only into the memory cell transistor MT ("PRM") in the write operation for the block BLK to which the high-speed mode is applied. Accordingly, as shown in FIG. 27 (*a*), the threshold voltage distribution after the write operation is executed and before the acceleration operation is executed is similar to the threshold voltage distribution shown in FIG. 22, for example.

In addition, in the acceleration operation, the memory cell transistor MT ("INH") is caused to be in the "D" state as described above. Accordingly, as shown in FIG. 27 (*b*), the threshold voltage distribution of the memory cell transistors MT after the acceleration operation is executed is similar to the threshold voltage distribution shown in FIG. 10, for example.

Although not shown, the threshold voltage distribution of the select transistors ST1 has a threshold voltage distribution similar to that in FIG. 11 (*a*) after the write operation is executed and before the acceleration operation is executed.

That is, all the select transistors ST1 have the "s0" state. In addition, the threshold voltage distribution of the select transistors ST1 has a threshold voltage distribution similar to that in FIG. 11 (*b*) after the acceleration operation is executed. That is, the select transistors ST1 ("PRM") and ST1 ("INH") have the "s0" state and the "s1" state, respectively.

With such an operation described above, in the read operation in which the high-speed mode according to the third modification is applied, the NAND string NS ("INH") is caused to be in the inhibited state, similarly to the read operation in the semiconductor memory device according to the embodiment.

With the third modification, effects similar to those of the embodiment, the first modification, and the second modification are also achieved. To supplement, according to the third modification, it is possible to improve the speed of the read operation, similarly to the embodiment, the first modification, and the second modification. Therefore, it is possible to improve the operation speed of the semiconductor memory device 1. 3 Others Note that, the embodiment describes the example in which the threshold voltage of the memory cell transistor MT ("INH") and the threshold voltage of the select transistor ST1 ("INH") are raised in the acceleration operation, but is not limited thereto. In addition to the threshold voltage of the memory cell transistor MT ("INH") and the threshold voltage of the select transistor ST1 ("INH"), the threshold voltage of the select transistor ST2 ("INH") may be raised. Accordingly, in the write operation and read operation for the block BLK to which the high-speed mode is applied, the select transistors ST2 ("INH") and ST2 ("PRM") included in the block BLK can be caused to be in the "s1" state and the "s0" state, respectively, similarly to the second modification. Note that, in the read operation for the block BLK to which the high-speed mode is applied, the memory cell transistors MT0 ("INH") to MT7 ("INH") included in the NAND string NS ("INH") are caused to be in the floating state by the select transistors ST1 ("INH") and ST2 ("INH") caused to be in the OFF state, similarly to the second modification. With such a configuration described above, effects similar to those of the embodiment, the first modification, the second modification, and the third modification are also obtained.

In addition, the embodiment describes the example in which the threshold voltage of the select transistor ST1 ("INH") is also raised in addition to the memory cell transistor MT ("INH") in the acceleration operation, but is not limited thereto. In the acceleration operation, the threshold voltage of the select transistor ST1 ("INH") may not be raised. In this case, in the acceleration operation, instead of causing all the memory cell transistors MT ("INH") included in each NAND string NS ("INH") to be in the "D" state, only two memory cell transistors MT ("INH") closest to the one end side and the other end side may be caused to be in the "D" state, for example. That is, in the acceleration operation, the memory cell transistors MT0 ("INH") and MT7 ("INH") may be caused to be in the "D" state, and the memory cell transistors MT1 ("INH") to MT6 ("INH") may be caused to be in the "Er" state to the "C" state, for example. Note that, in the read operation for the block BLK to which the high-speed mode is applied, the memory cell transistors MT1 ("INH") to MT6 ("INH") included in the NAND string NS ("INH") are caused to be in the floating state by the memory cell transistors MT0 ("INH") and MT7 ("INH") caused to be in the OFF state. With such a configuration described above, effects similar to those of the embodiment, the first modification, the second modification, the third modification, and the other examples described above are also obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a first memory string in which a plurality of memory cell transistors including a first memory cell transistor are coupled in series;

a second memory string in which a plurality of memory cell transistors including a second memory cell transistor are coupled in series;

a first word line commonly coupled to a gate of each of the first memory cell transistor and the second memory cell transistor;

a third memory cell transistor included in the first memory string;

a fourth memory cell transistor included in the second memory string;

a second word line commonly coupled to a gate of each of the third memory cell transistor and the fourth memory cell transistor;

a fifth memory cell transistor included in the first memory string;

a sixth memory cell transistor included in the second memory string;

a third word line commonly coupled to a gate of each of the fifth memory cell transistor and the sixth memory cell transistor; and a control circuit, wherein:

the fifth memory cell transistor is provided between the first memory cell transistor and the third memory cell transistor, the sixth memory cell transistor is provided between the second memory cell transistor and the fourth memory cell transistor, and during a first read operation of reading data from the first memory string:

a threshold voltage of the first memory cell transistor is less than a first voltage, a threshold voltage of the second memory cell transistor is equal to or greater than the first voltage, a threshold voltage of the third memory cell transistor is less than the first voltage, a threshold voltage of the fourth memory cell transistor is equal to or greater than the first voltage, a threshold voltage of the fifth memory cell transistor and a threshold voltage of the sixth memory cell transistor are less than the first voltage, and the control circuit is configured to supply a voltage equal to or less than the first voltage to the first word line, the second word line, and the third word line.

2. The semiconductor memory device of claim 1, wherein a wiring length between the control circuit and the second memory cell transistor is longer than a wiring length between the control circuit and the first memory cell transistor.

3. The semiconductor memory device of claim 1, further comprising:

a first select transistor included in the first memory string;

a second select transistor included in the second memory string; and a first select gate line commonly coupled to a gate of each of the first select transistor and the second select transistor, wherein:

the first select transistor is coupled to one of ends of the memory cell transistors of the first memory string, and the second select transistor is coupled to one of ends of the memory cell transistors of the second memory string, and during the first read operation:

a threshold voltage of the first select transistor is less than a second voltage, a threshold voltage of the second select transistor is equal to or greater than the second voltage, and the control circuit is configured to supply the second voltage to the first select gate line.

4. The semiconductor memory device of claim 3, further comprising:

a seventh memory cell transistor included in the first memory string;

an eighth memory cell transistor included in the second memory string; and a fourth word line commonly coupled to a gate of each of the seventh memory cell transistor and the eighth memory cell transistor, wherein:

the seventh memory cell transistor is provided between the first memory cell transistor and the first select transistor, the eighth memory cell transistor is provided between the second memory cell transistor and the second select transistor, and during the first read operation:

a threshold voltage of the seventh memory cell transistor and a threshold voltage of the eighth memory cell transistor are less than the first voltage, and the control circuit is configured to supply the voltage equal to or less than the first voltage to the fourth word line.

5. The semiconductor memory device of claim 3, wherein the control circuit is configured, in an acceleration operation before the first read operation, to raise the threshold voltage of the second select transistor to be equal to or greater than the second voltage and to maintain the threshold voltage of the first select transistor to be less than the second voltage, and to raise the threshold voltage of the second memory cell transistor to be equal to or greater than the first voltage and to maintain the threshold voltage of the first memory cell transistor to be less than the first voltage.

6. The semiconductor memory device of claim 1, wherein the control circuit is configured, in an acceleration operation before the first read operation, to raise the threshold voltage of the second memory cell transistor to be equal to or greater than the first voltage and to maintain the threshold voltage of the first memory cell transistor to be less than the first voltage.

7. The semiconductor memory device of claim 1, further comprising:

a third memory string in which a plurality of memory cell transistors including a seventh memory cell transistor is coupled in series, wherein:

a gate of the seventh memory cell transistor is commonly coupled to the first word line together with the gate of each of the first memory cell transistor and the second memory cell transistor, and during the first read operation, a threshold voltage of the seventh memory cell transistor is equal to or greater than the first voltage.

8. The semiconductor memory device of claim 1, wherein, during a first write operation of writing data into the first memory string:

the threshold voltage of the first memory cell transistor is less than the first voltage, the threshold voltage of the second memory cell transistor is equal to or greater than the first voltage, and the control circuit is configured to cause all the memory cell transistors included in the second memory string to be in an OFF state.

9. The semiconductor memory device of claim 8, wherein during a second write operation of writing data into the first memory string, the second write operation being different from the first write operation, a threshold voltage of all the memory cell transistors included in the first memory string and the second memory string is less than the first voltage.

10. The semiconductor memory device of claim 9, wherein a period required for writing first data in the first write operation is shorter than a period required for writing the first data in the second write operation.

11. The semiconductor memory device of claim 9, wherein a boosting period for raising a word line being a target of writing to a second voltage being a write voltage in the first write operation is shorter than a boosting period for raising a word line being a target of writing to the second voltage in the second write operation.

12. The semiconductor memory device of claim 1, further comprising:

a plurality of third memory strings in each of which a plurality of memory cell transistors are coupled in series, wherein:

the first memory string, the second memory string, and the first word line are included in a first memory region, the third memory strings are included in a second memory region different from the first memory region, and during a second read operation of reading data from the third memory strings, the second read operation being different from the first read operation, a threshold voltage of all the memory cell transistors included in the third memory strings is less than the first voltage.

13. A semiconductor memory device comprising:

a first memory string in which a plurality of memory cell transistors including a first memory cell transistor are coupled in series;

a second memory string in which a plurality of memory cell transistors including a second memory cell transistor are coupled in series;

a first word line commonly coupled to a gate of each of the first memory cell transistor and the second memory cell transistor; and a control circuit, wherein:

during a first read operation of reading data from the first memory string:

a threshold voltage of the first memory cell transistor is less than a first voltage, a threshold voltage of the second memory cell transistor is equal to or greater than the first voltage, the control circuit is configured to supply a voltage equal to or less than the first voltage to the first word line, and the control circuit is configured to cause all the memory cell transistors included in the second memory string to be in an OFF state, and during a second read operation of reading data from the first memory string, the second read operation being different from the first read operation:

a threshold voltage of all the memory cell transistors included in the first memory string and the second memory string is less than the first voltage, and the control circuit is configured to supply the voltage equal to or less than the first voltage to the first word line.

14. The semiconductor memory device of claim 13, wherein a period required to read first data in the first read operation is shorter than a period required to read the first data in the second read operation.

15. The semiconductor memory device of claim 13, wherein a boosting period in a case where a word line is boosted to the first voltage in the first read operation is shorter than a boosting period in a case where a word line is boosted to the first voltage in the second read operation.

16. A semiconductor memory device comprising:

a first memory string in which a plurality of memory cell transistors including a first memory cell transistor are coupled in series;

a second memory string in which a plurality of memory cell transistors including a second memory cell transistor are coupled in series;

a first word line commonly coupled to a gate of each of the first memory cell transistor and the second memory cell transistor;

a first select transistor included in the first memory string;

a second select transistor included in the second memory string;

a first select gate line commonly coupled to a gate of each of the first select transistor and the second select transistor; and a control circuit, wherein:

the first select transistor is coupled to one of ends of the memory cell transistors of the first memory string, the second select transistor is coupled to one of ends of the memory cell transistors of the second memory string, and during a first read operation of reading data from the first memory string:

a threshold voltage of the first memory cell transistor is less than a first voltage, a threshold voltage of the second memory cell transistor is equal to or greater than the first voltage, a threshold voltage of the first select transistor is less than a second voltage, a threshold voltage of the second select transistor is equal to or greater than the second voltage, the control circuit is configured to supply a voltage equal to or less than the first voltage to the first word line, and the control circuit is configured to supply the second voltage to the first select gate line.

17. A semiconductor memory device comprising:

a first memory string in which a plurality of memory cell transistors including a first memory cell transistor are coupled in series;

a second memory string in which a plurality of memory cell transistors including a second memory cell transistor are coupled in series;

a first word line commonly coupled to a gate of each of the first memory cell transistor and the second memory cell transistor; and a control circuit, wherein:

during a first read operation of reading data from the first memory string:

a threshold voltage of the first memory cell transistor is less than a first voltage, a threshold voltage of the second memory cell transistor is equal to or greater than the first voltage, the control circuit is configured to supply a voltage equal to or less than the first voltage to the first word line, and the control circuit is configured, in an acceleration operation before the first read operation, to raise the threshold voltage of the second memory cell transistor to be equal to or greater than the first voltage and to maintain the threshold voltage of the first memory cell transistor to be less than the first voltage.

18. A semiconductor memory device comprising:

a first memory string in which a plurality of memory cell transistors including a first memory cell transistor are coupled in series;

a second memory string in which a plurality of memory cell transistors including a second memory cell transistor are coupled in series;

a first word line commonly coupled to a gate of each of the first memory cell transistor and the second memory cell transistor; and a control circuit, wherein:

during a first read operation of reading data from the first memory string:

a threshold voltage of the first memory cell transistor is less than a first voltage, a threshold voltage of the second memory cell transistor is equal to or greater than the first voltage, and the control circuit is configured to supply a voltage equal to or less than the first voltage to the first word line, during a first write operation of writing data into the first memory string:

the threshold voltage of the first memory cell transistor is less than the first voltage, the threshold voltage of the second memory cell transistor is equal to or greater than the first voltage, and the control circuit is configured to cause all the memory cell transistors included in the second memory string to be in an OFF state, and during a second write operation of writing data into the first memory string, the second write operation being different from the first write operation, a threshold voltage of all the memory cell transistors included in the first memory string and the second memory string is less than the first voltage.

19. A semiconductor memory device comprising:

a first memory string in which a plurality of memory cell transistors including a first memory cell transistor are coupled in series;

a second memory string in which a plurality of memory cell transistors including a second memory cell transistor are coupled in series;

a plurality of third memory strings in each of which a plurality of memory cell transistors are coupled in series, a first word line commonly coupled to a gate of each of the first memory cell transistor and the second memory cell transistor; and a control circuit, wherein:

the first memory string, the second memory string, and the first word line are included in a first memory region, the third memory strings are included in a second memory region different from the first memory region, during a first read operation of reading data from the first memory string:

a threshold voltage of the first memory cell transistor is less than a first voltage, a threshold voltage of the second memory cell transistor is equal to or greater than the first voltage, and the control circuit is configured to supply a voltage equal to or less than the first voltage to the first word line, and during a second read operation of reading data from the third memory strings, the second read operation being different from the first read operation, a threshold voltage of all the memory cell transistors included in the third memory strings is less than the first voltage.

* * * * *